(12) United States Patent
Choi et al.

(10) Patent No.: US 11,114,994 B2
(45) Date of Patent: Sep. 7, 2021

(54) MULTILAYER FILTER INCLUDING A LOW INDUCTANCE VIA ASSEMBLY

(71) Applicant: AVX Corporation, Fountain Inn, SC (US)

(72) Inventors: Kwang Choi, Simpsonville, SC (US); Marianne Berolini, Greenville, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/718,255

(22) Filed: Dec. 18, 2019

(65) Prior Publication Data

US 2020/0204142 A1 Jun. 25, 2020

Related U.S. Application Data

(60) Provisional application No. 62/782,472, filed on Dec. 20, 2018.

(51) Int. Cl.
*H03H 7/01* (2006.01)
*H03H 1/00* (2006.01)
*H03H 3/00* (2006.01)

(52) U.S. Cl.
CPC ............ *H03H 7/0115* (2013.01); *H03H 1/00* (2013.01); *H03H 3/00* (2013.01); *H03H 7/1725* (2013.01); *H03H 2001/0085* (2013.01)

(58) Field of Classification Search
CPC ...................... H03H 7/0115; H03H 2001/0085
USPC .................................................. 333/175, 185
See application file for complete search history.

(56) References Cited

U.S. PATENT DOCUMENTS

| 5,357,227 | A  | 10/1994 | Tonegawa et al. |
| 6,414,835 | B1 | 7/2002  | Wolf et al.     |
| 6,720,848 | B2 | 4/2004  | Okamura et al.  |
| 6,771,148 | B2 | 8/2004  | Okamura et al.  |

(Continued)

FOREIGN PATENT DOCUMENTS

| EP | 2 068 393 A1 | 6/2009 |
| JP | 4539422 B2   | 9/2010 |
| JP | 5152192 B2   | 2/2013 |

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.

(Continued)

*Primary Examiner* — Rakesh B Patel
(74) *Attorney, Agent, or Firm* — Dority & Manning, P.A.

(57) ABSTRACT

A multilayer filter may include a dielectric layer having a top surface, a bottom surface, and a thickness in a Z-direction between the top surface and the bottom surface. The multilayer filter may include a conductive layer formed on the top surface of the dielectric layer. The multilayer filter may include a via assembly formed in the dielectric layer and connected to the conductive layer on the top surface of the dielectric layer. The via assembly may extend to the bottom surface of the dielectric layer. The via assembly may have a length in the Z-direction and a total cross-sectional area in an X-Y plane that is perpendicular to the Z-direction. The via assembly may have an area-to-squared-length ratio that is greater than about 3.25.

50 Claims, 30 Drawing Sheets

(56) References Cited

U.S. PATENT DOCUMENTS

| | | |
|---|---|---|
| 6,940,724 B2 | 9/2005 | Divakar et al. |
| 6,958,667 B2 | 10/2005 | Mizoguchi et al. |
| 6,970,057 B2 | 11/2005 | Lin et al. |
| 7,098,760 B2 | 8/2006 | Okamura et al. |
| 7,119,639 B2 | 10/2006 | Okamura et al. |
| 7,187,109 B2 | 3/2007 | Tikka et al. |
| 7,239,221 B2 | 7/2007 | Okamura et al. |
| 7,268,648 B2 | 9/2007 | Okamura et al. |
| 7,312,676 B2 | 12/2007 | Kundu |
| 7,489,914 B2 | 2/2009 | Govind et al. |
| 8,013,688 B2 | 9/2011 | White et al. |
| 8,067,723 B2 | 11/2011 | Yamada et al. |
| 8,081,052 B2 | 12/2011 | Kim et al. |
| 8,106,722 B2 | 1/2012 | Shimamura et al. |
| 8,451,073 B2 | 5/2013 | Hoeft et al. |
| 8,754,726 B2 | 6/2014 | Sasaki et al. |
| 10,277,190 B2 | 4/2019 | Masuda et al. |
| 10,389,329 B2 | 8/2019 | Shiokawa |
| 10,644,376 B2 | 5/2020 | Nita et al. |
| 2002/0063611 A1* | 5/2002 | Tojyo ................ H03H 7/09 333/185 |
| 2003/0214364 A1* | 11/2003 | Cites ................ H01P 5/08 333/33 |
| 2006/0055489 A1 | 3/2006 | Okamura et al. |
| 2008/0116998 A1* | 5/2008 | Sekine ............ H03H 7/0115 333/185 |
| 2009/0033439 A1 | 2/2009 | Igarashi |
| 2011/0133860 A1* | 6/2011 | Fukamachi ........ H01P 1/2135 333/204 |
| 2015/0188511 A1* | 7/2015 | Ishizuka ............ H01Q 1/50 343/860 |
| 2016/0276995 A1* | 9/2016 | Park ................ H01F 17/0013 |

OTHER PUBLICATIONS

Design Guide of Vishay Intertechnology, Inc., entitled "Thin Film Design Guide for Custom Substrates," dated 2018, 13 pages.

International Search Report and Written Opinion for PCT/US2019/067099 dated Apr. 17, 2020, 11 pages.

* cited by examiner

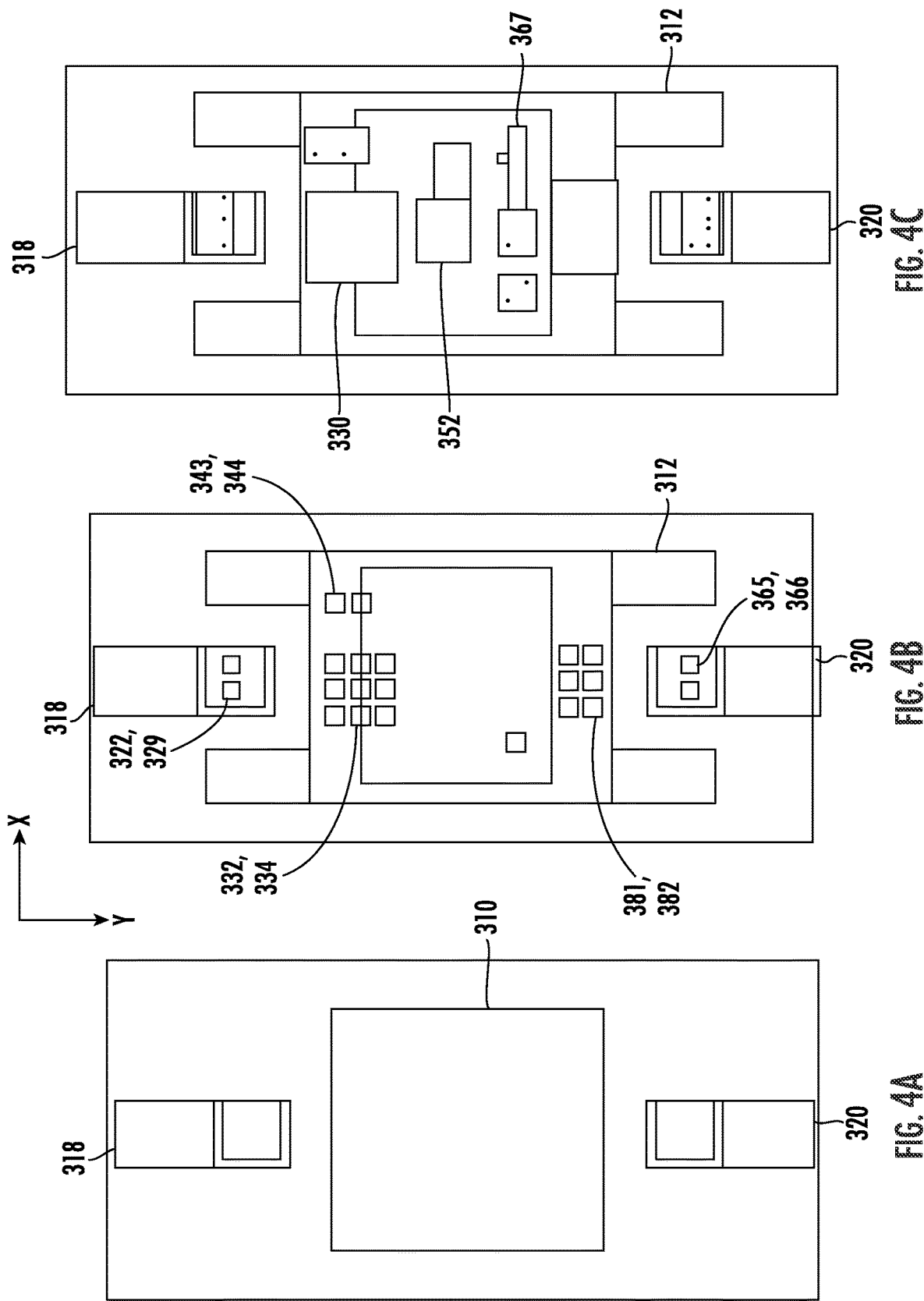

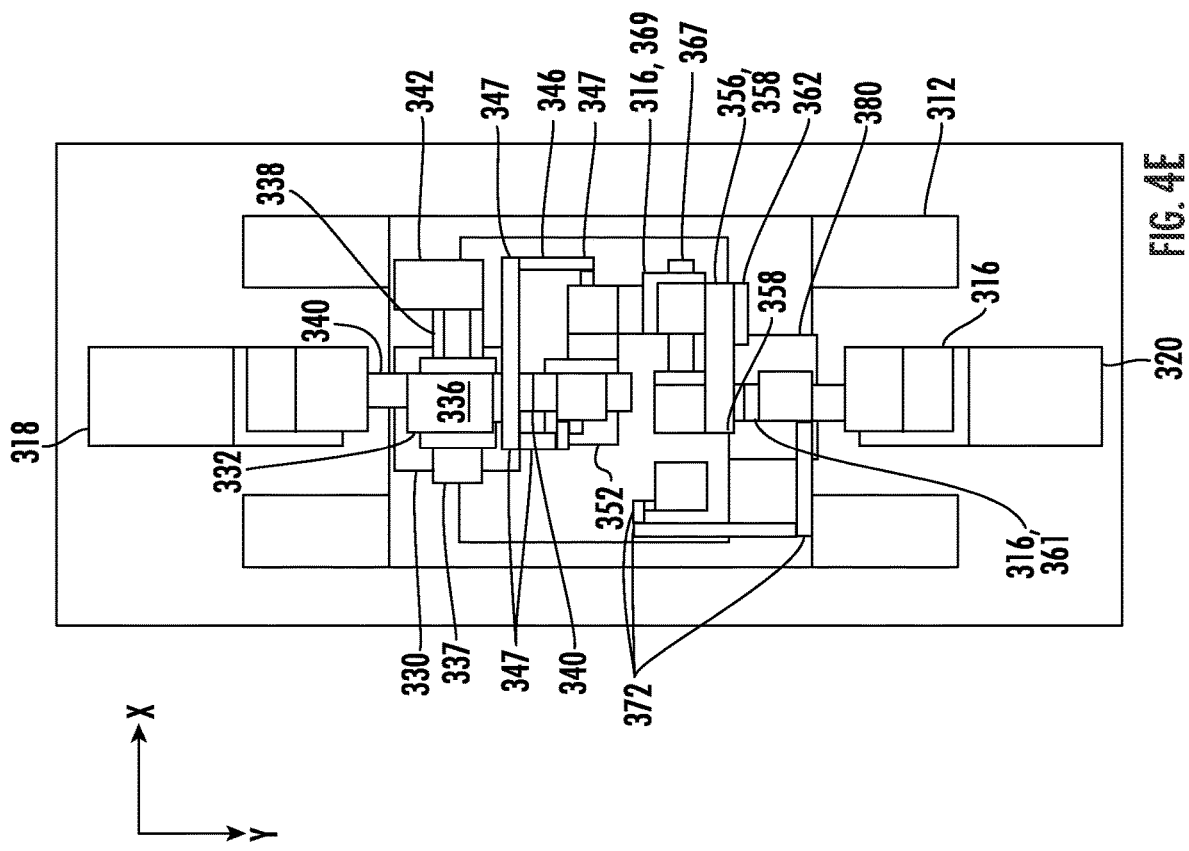
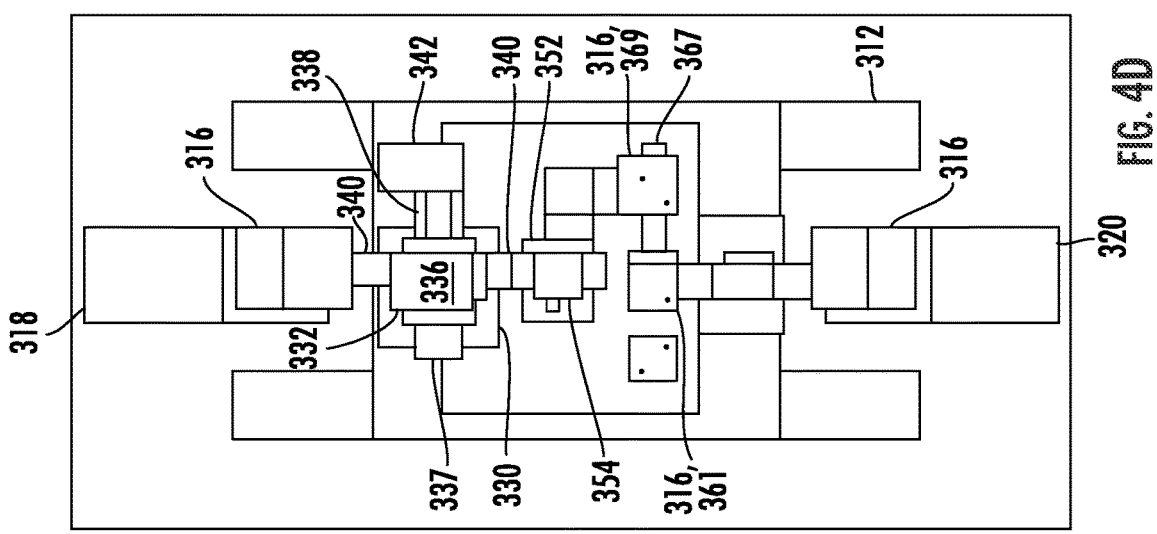

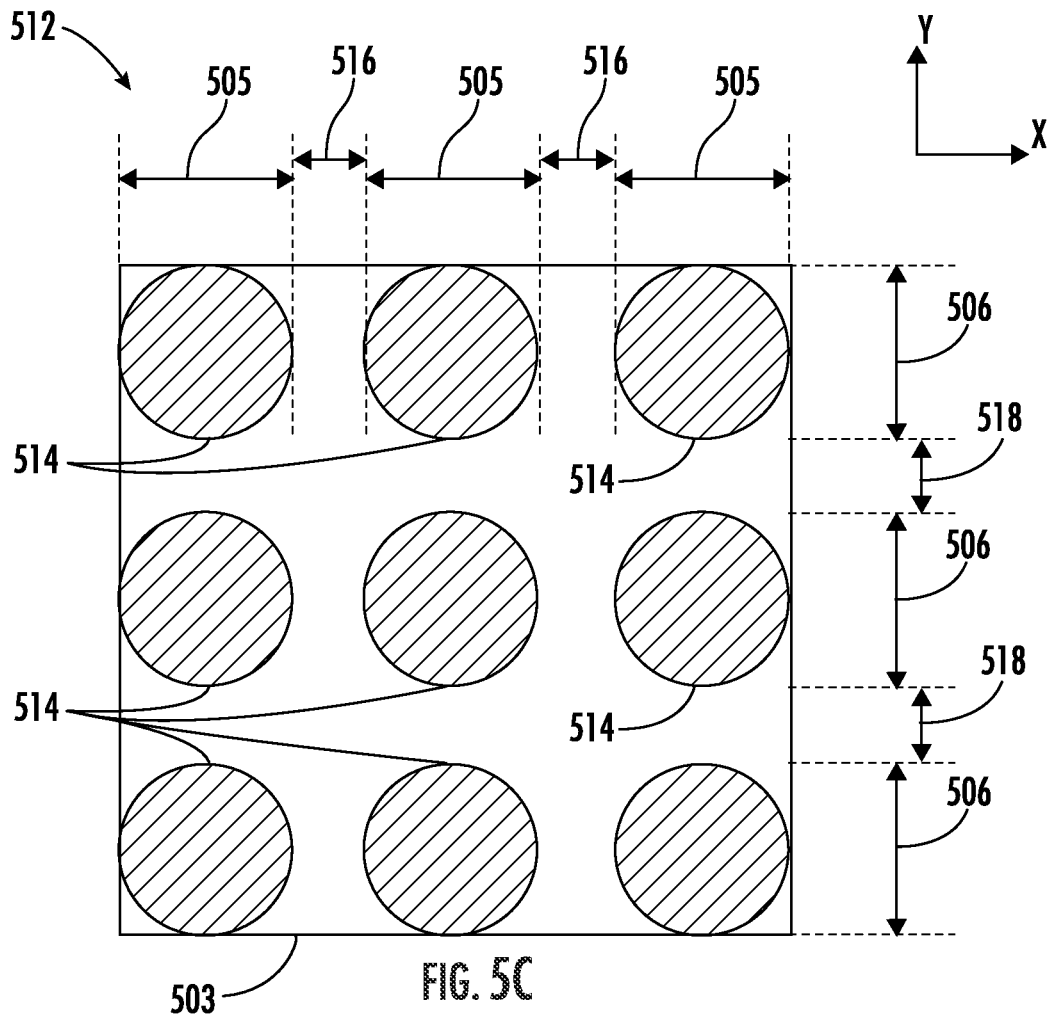
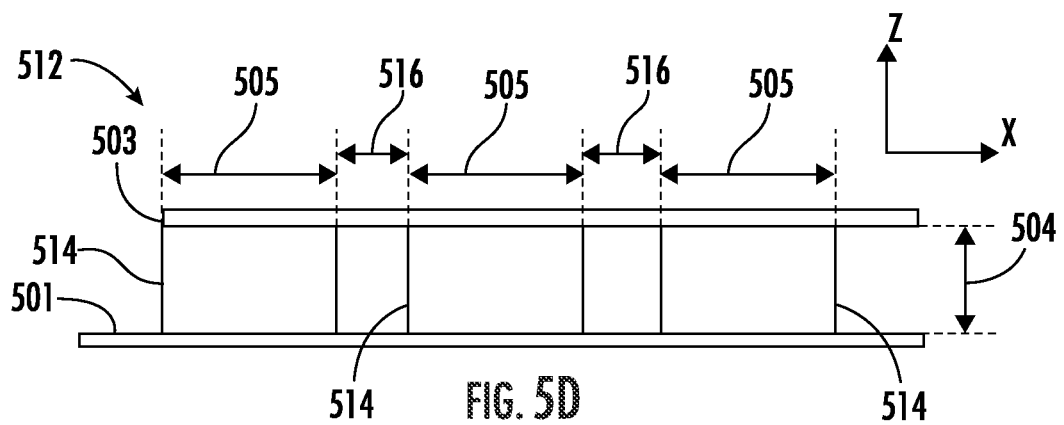

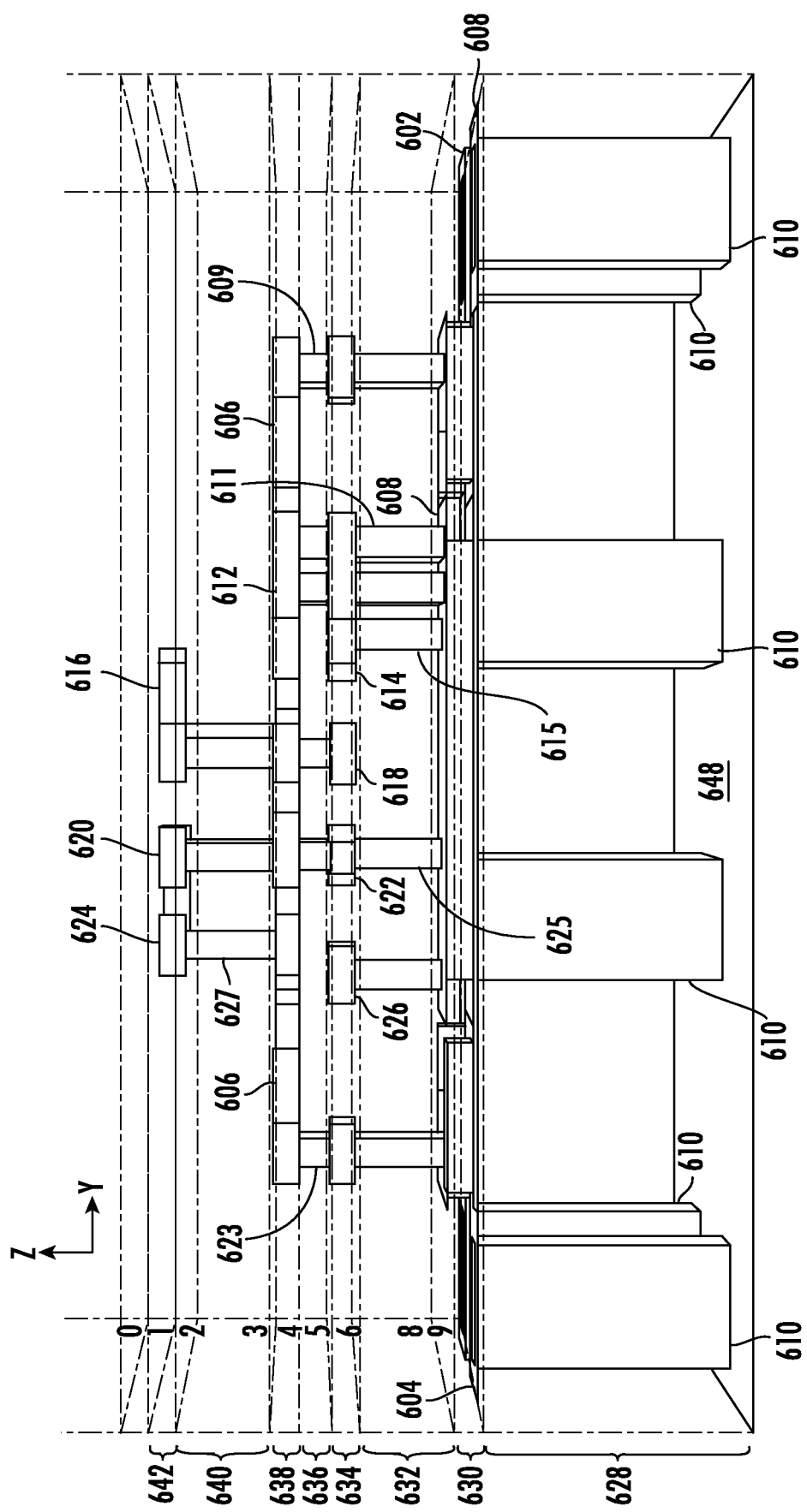

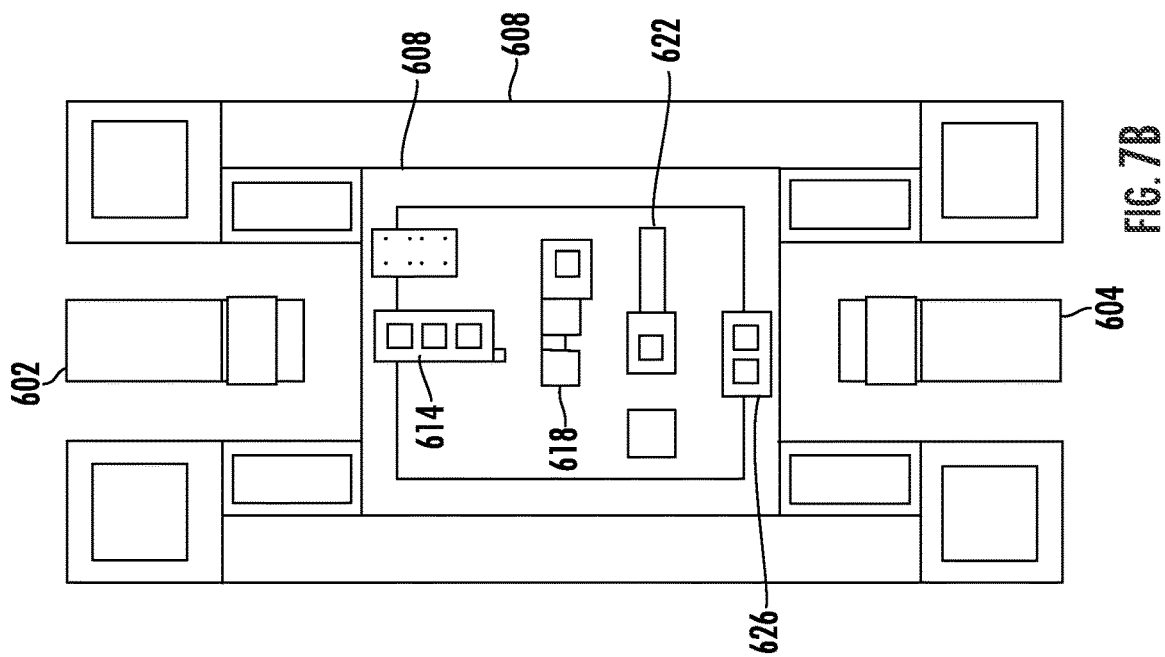
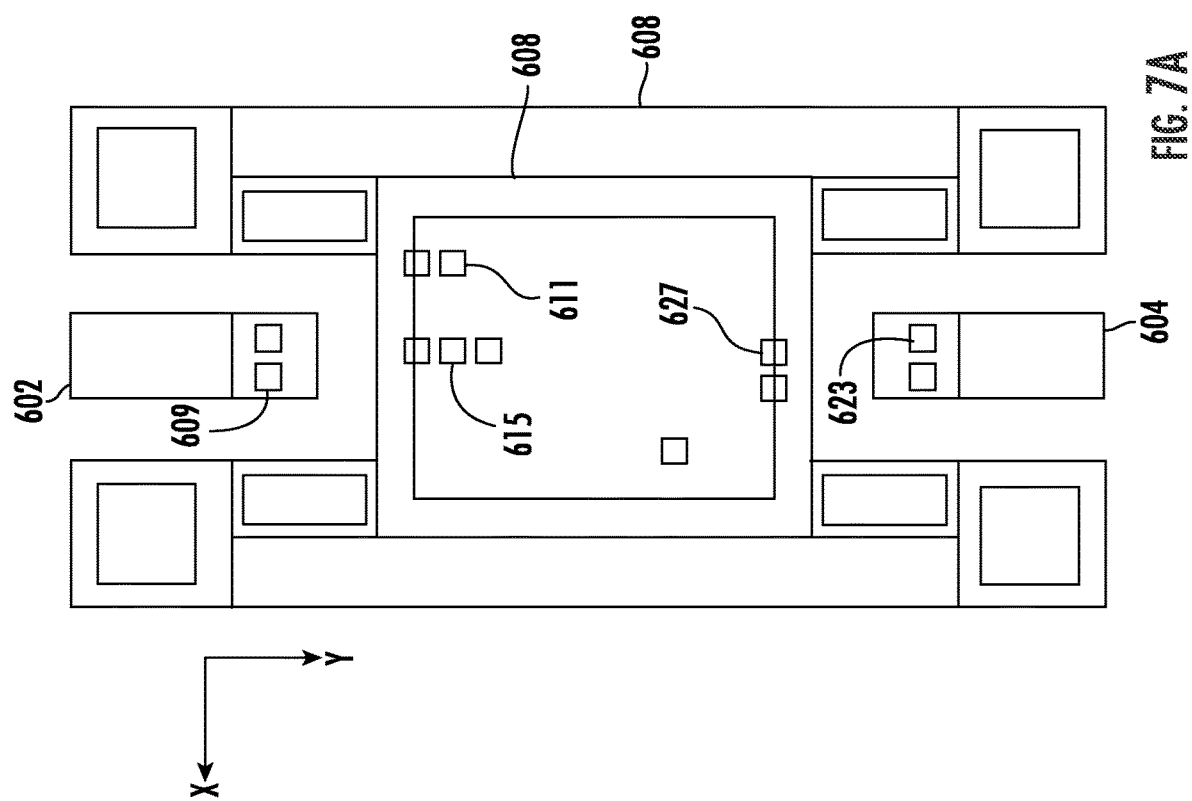

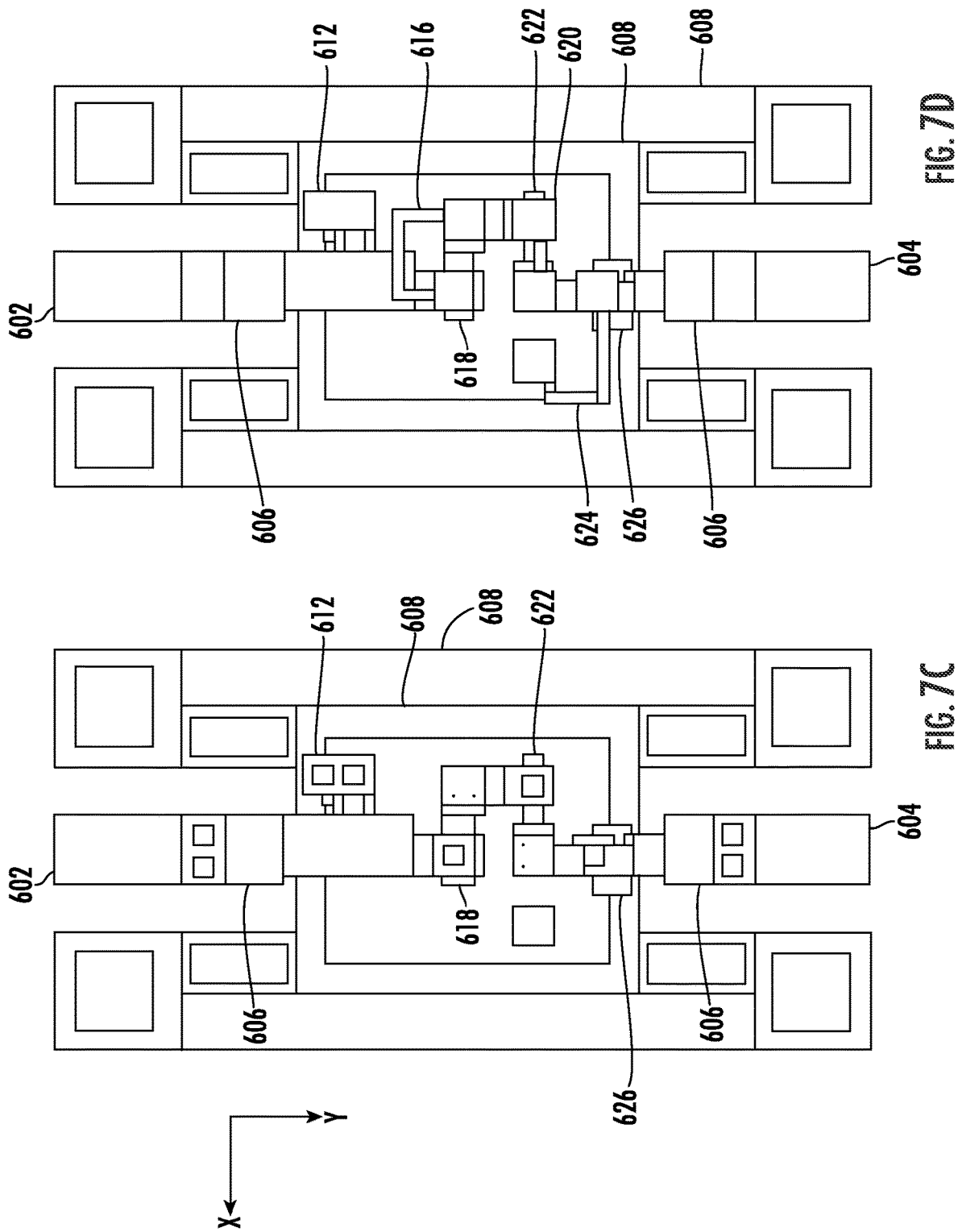

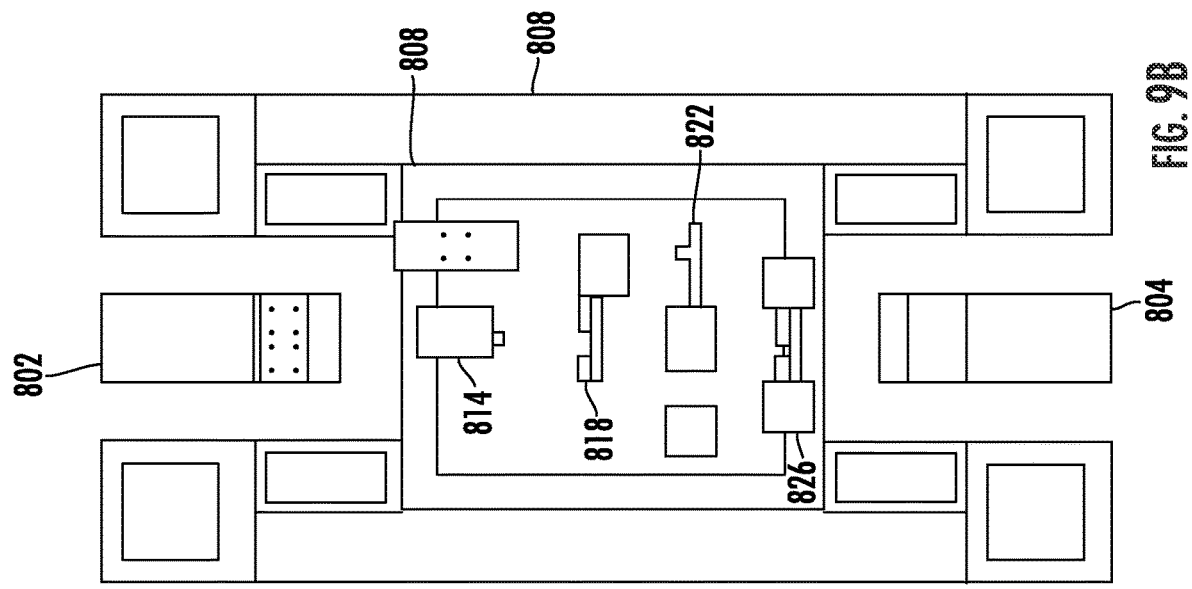
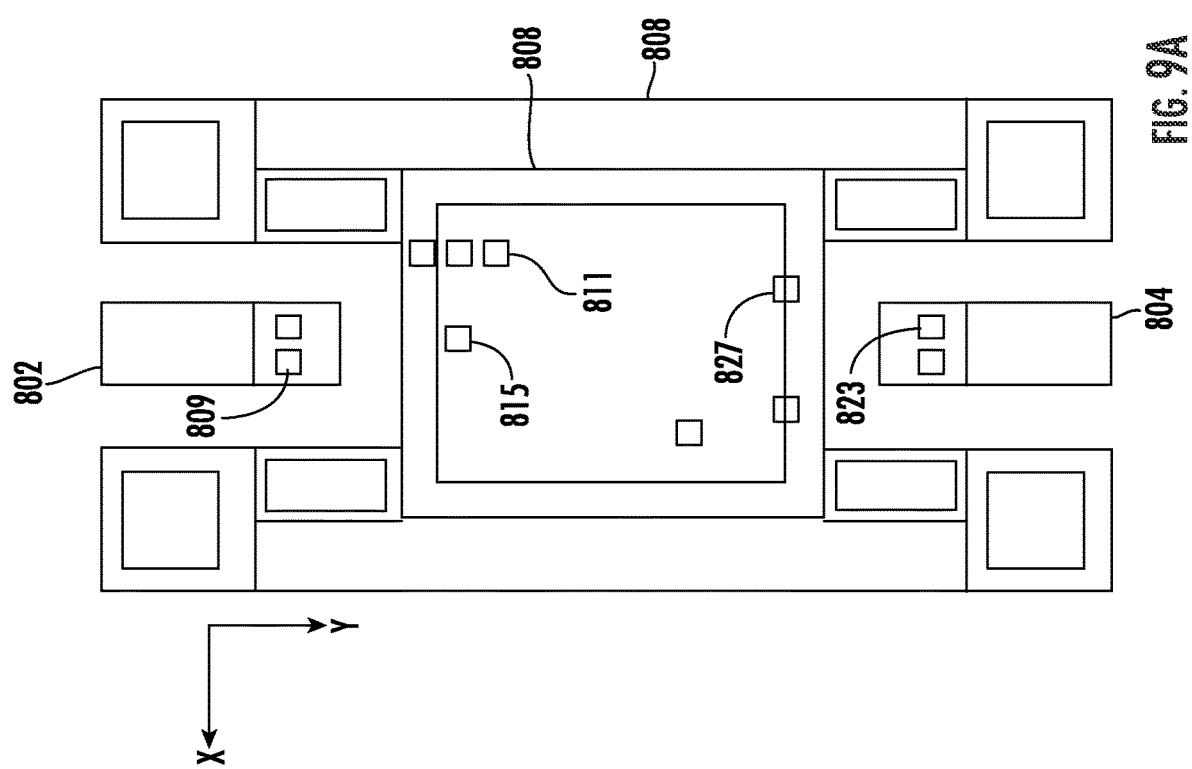

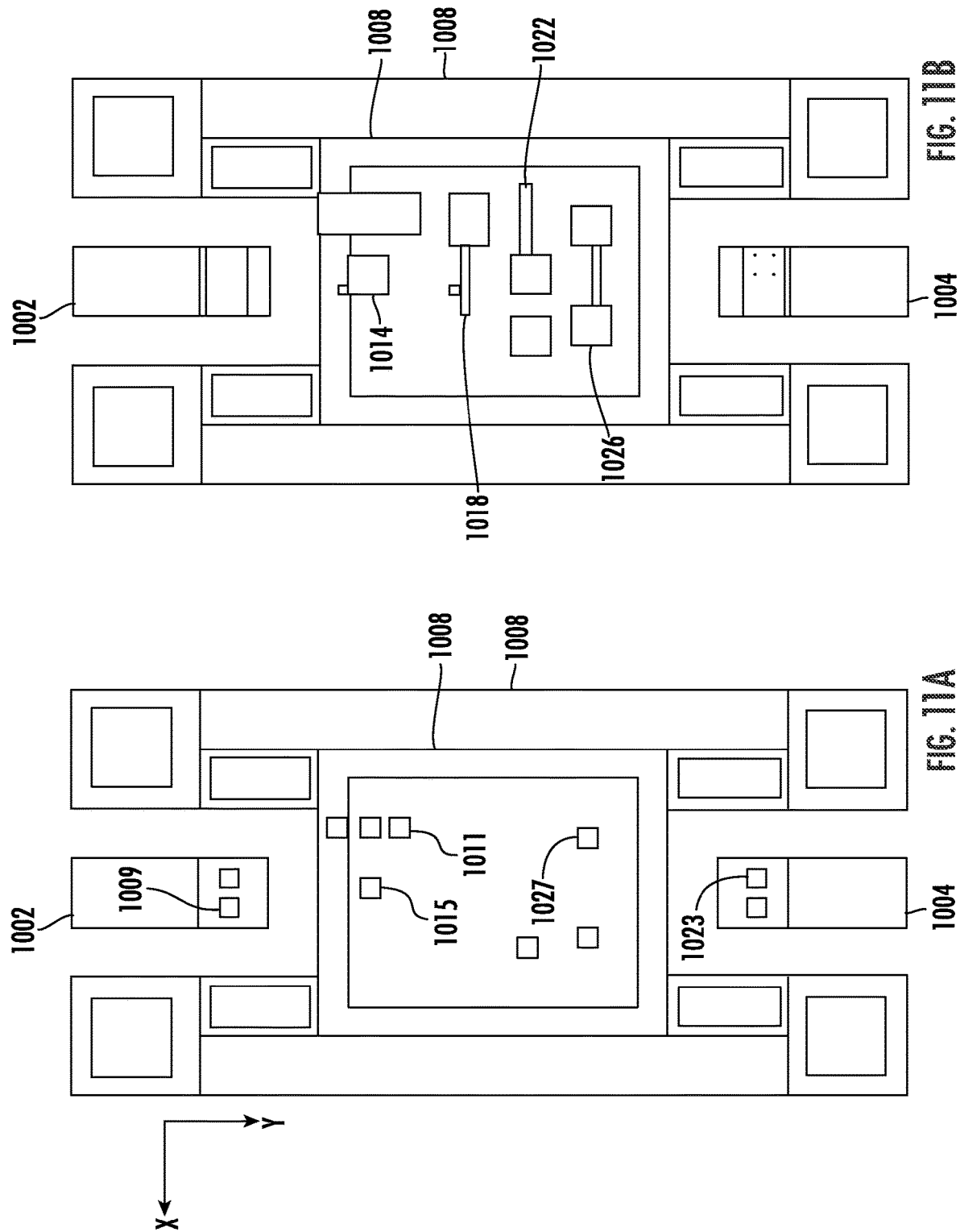

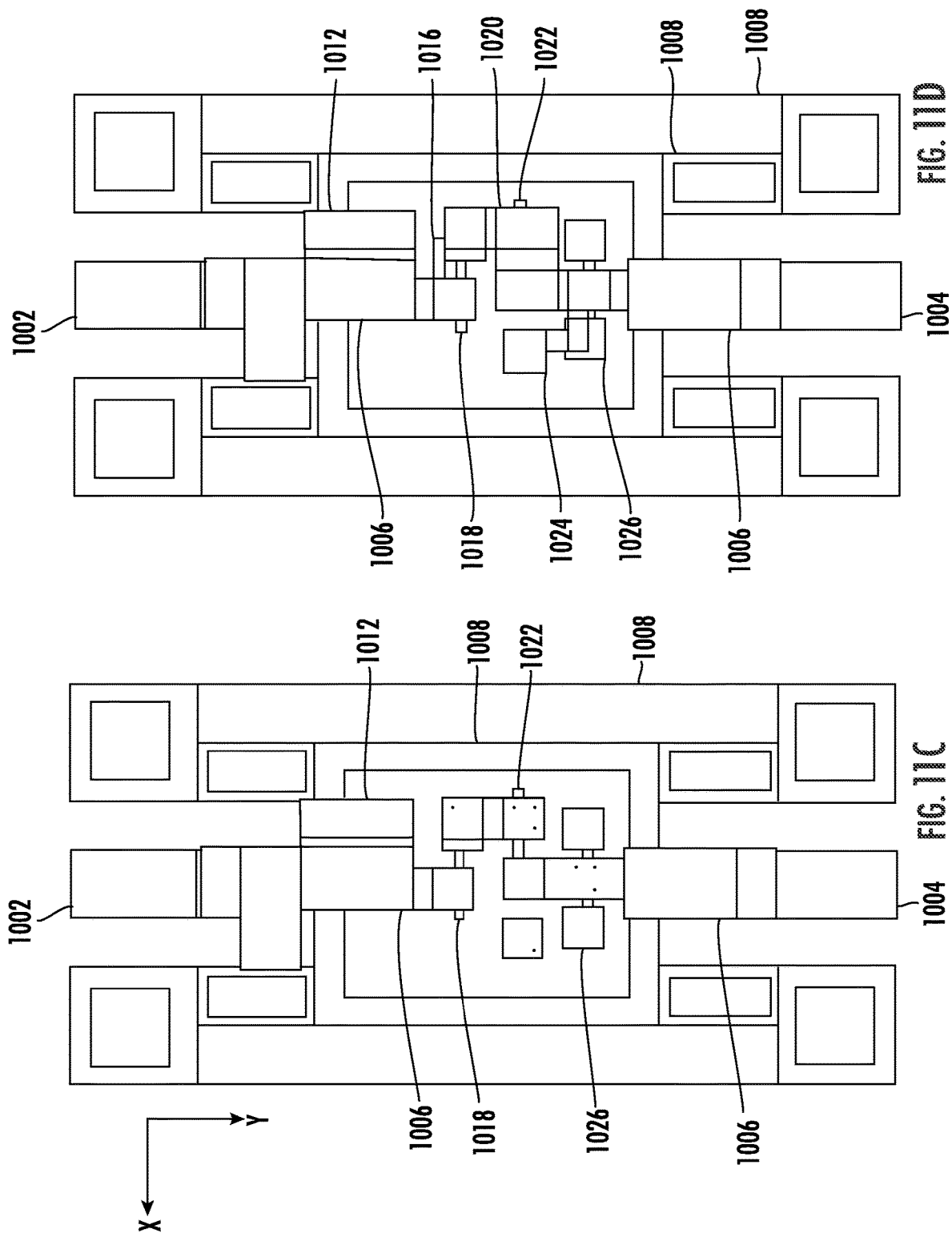

MULTILAYER FILTER INCLUDING A LOW INDUCTANCE VIA ASSEMBLY

CROSS REFERENCE TO RELATED APPLICATION

The present application claims filing benefit of U.S. Provisional Patent Application Ser. No. 62/782,472 having a filing date of Dec. 20, 2018, which is incorporated herein by reference in its entirety.

BACKGROUND OF THE DISCLOSURE

Electric filters perform many functions and are employed in a variety of electrical devices. For example, filtering of high frequency signals, such as high frequency radio signal communication, has recently increased in popularity. The demand for increased data transmission speed for wireless connectivity has driven demand for high frequency components, including those configured to operate at high frequencies, including 5G spectrum frequencies. Current high frequency filters generally employ waveguide or cavity designs. The performance characteristics of such designs, however, are difficult to tailor or customize.

Multilayer filters generally include vertical structures, such as vias, that can introduce parasitic inductance and undesirably alter the performance characteristics of the filter, for example at high frequencies.

SUMMARY OF THE DISCLOSURE

In accordance with one embodiment of the present disclosure, a multilayer filter may include a dielectric layer having a top surface, a bottom surface, and a thickness in a Z-direction between the top surface and the bottom surface. The multilayer filter may include a conductive layer formed on the top surface of the dielectric layer. The multilayer filter may include a via assembly formed in the dielectric layer and connected to the conductive layer on the top surface of the dielectric layer. The via assembly may extend to the bottom surface of the dielectric layer. The via assembly may have a length in the Z-direction and a total cross-sectional area in an X-Y plane that is perpendicular to the Z-direction. The via assembly may have an area-to-squared-length ratio that is greater than about 3.25.

In accordance with another embodiment of the present disclosure, a method of forming a multilayer filter may include providing a dielectric layer having a top surface, a bottom surface, and a thickness in a Z-direction between the top surface and the bottom surface. The method may include depositing a conductive layer on the top surface of the dielectric layer. The method may include forming a via assembly in the dielectric layer. The via assembly may be connected to the conductive layer on the top surface of the dielectric layer. The via assembly may extend to the bottom surface of the dielectric layer. The via assembly may have a length in the Z-direction and a total cross-sectional area in an X-Y plane that is perpendicular to the Z-direction. The via assembly may have an area-to-squared-length ratio that is greater than about 3.25.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 4A through 4E are a series of sequential top down views of the filter in which an additional layer is shown in each sequential figure;

FIG. 6C is a side elevation view of the filter of FIGS. 6A and 6B;

FIGS. 7A through 7D are a series of sequential top down views of the filter of FIGS. 8A and 8B in which an additional layer is shown in each sequential figure;

FIGS. 9A through 9D are a series of sequential top down views of the filter of FIGS. 8A and 8B in which an additional layer is shown in each sequential Figure;

FIGS. 11A through 11D are a series of sequential top down views of the filter of FIGS. 10A and 10B in which an additional layer is shown in each sequential figure;

FIG. 15 is a plot of simulation data including insertion loss and return loss values from a computer analysis of a filter according to aspects of the present disclosure;

Figure 1:
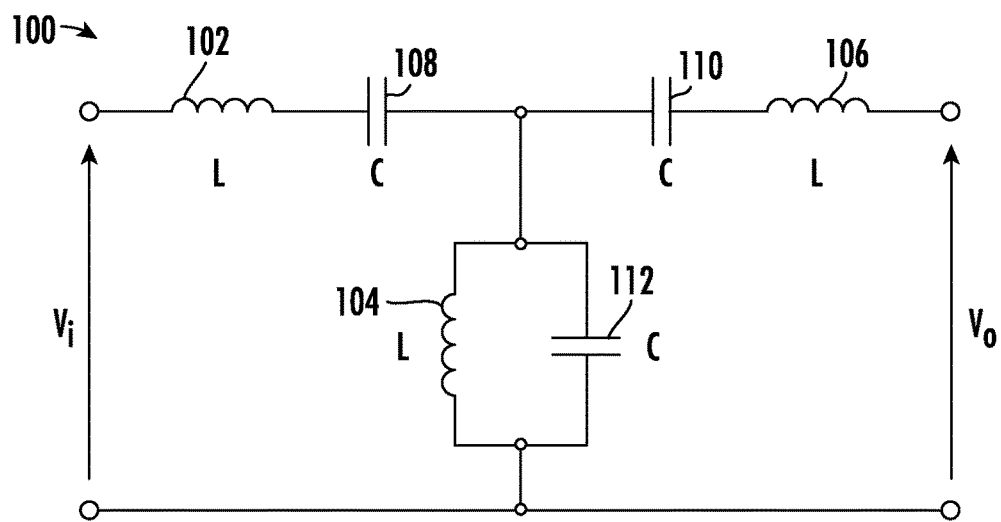
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a multilayer filter including a via assembly. The via assembly may include one or more vias. The via assembly may be configured to exhibit a low inductance such that the via assembly does not undesirably affect performance characteristics of the multilayer filter. For example, the multilayer filter may include one or more inductors, which may be configured to exhibit precise inductance values that are selected to provide the filter with certain performance characteristics (e.g., insertion loss and/or return loss characteristics). Thus, the via assembly may be configured to exhibit minimal levels of unwanted or parasitic inductance.

In some embodiments, the multilayer filter may be configured for operation at high frequencies. In some embodiments, the filter may have a characteristic frequency that is greater than about 6 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments in some embodiments greater than about 80 GHz. Examples of characteristic frequencies include a low pass frequency, a high pass frequency, an upper bound of a bandpass frequency, or a lower bound of the bandpass frequency.

As indicated above, the multilayer filter may include one or more inductors. The inductor(s) may include a conductive layer formed on one of the plurality of dielectric layers. In some embodiments, the inductor(s) may be electrically connected at a first location with the signal path and electrically connected at a second location with at least one of the signal path or a ground. For example, the inductor may form a portion of the signal path or may be connected between the signal path and ground.

In some embodiments, the inductor may include at least one corner. The corner may have an angle greater than about 20 degrees, (e.g., 90 degrees). The inductor may have from one to nine corners, or more, in some embodiments, the inductor may have fewer than six corners, in some embodiments fewer than four corners, in some embodiments fewer than three corners, and in some embodiments fewer than two corners. In some embodiments, the inductor may be free of any corners. In some embodiments, the inductor may define a full "loop" or less. For example, the inductor may define less than one half of a "loop."

The inductor may have an effective length between the first location and the second location. The effective length may be defined as the length along the conductive layer between the first location and the second location. For example, the effective length may equal a sum of lengths of various straight portions of the inductor (e.g., in the X-Y plane) connected between the first location and the second location. The effective length of the inductor may be less than about 5 mm, in some embodiments less than about 3 mm, in some embodiments less than about 2 mm, in some embodiments less than about 1 mm, in some embodiments less than about 800 microns, in some embodiments less than about 500 microns, in some embodiments less than about 300 microns, in some embodiments less than about 200 microns, and in some embodiments less than about 100 microns.

The conductive layer of the inductor may have a width that is less than about 1000 microns, in some embodiments less than about 500 microns, in some embodiments less than about 300 microns, in some embodiments less than about 200 microns, and in some embodiments less than about 100 microns.

In some embodiments, a ratio of the length to the width of the conductive layer of the inductor may range from about 0.5 to about 60, in some embodiments from about 0.8 to about 50, and in some embodiments from about 1 to about 30.

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation., and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other thermoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including N6000, epoxy based N4000-13, bromine-free material laminated to LCP, organic layers with high K material, unfilled high-K organic layers, Rogers 4350, Rogers 4003 material (from the Rogers Corporation), and other theremoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetraflouroethylene resins, BT resin composites (e.g., Speedboard C), thermosets (e.g., Hitachi MCL-LX-67F), and graft resins, or similar low dielectric constant, low-loss organic material.

Additionally, non-organic dielectric materials may be used including a ceramic, semi-conductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor may be a copper foil which is chemically etched to provide the patterns. In still further embodiments, dielectric material may comprise a material having a relatively high dielectric constant (K), such as one of NPO (COG), X7R, X5R X7S, ZSU, Y5V and strontium titanate. In such examples, the dielectric material may have a dielectric constant that is greater than 100, for example within a range from between about 100 to about 4000, in some embodiments from about 1000 to about 3000.

The multilayer filter may include a signal path having an input and an output. The signal path may include one or more conductive layers formed on one or more of the dielectric layers. The conductive layers may include a variety of conductive materials. For example, the conductive layers may include copper, nickel, gold, silver, or other metals or alloys.

The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to for form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

The multilayer filter may include one or more vias formed in one or more of the dielectric layers. For example, a via may electrically connect a conductive layer on one dielectric layer (e.g., forming a capacitor or inductor) with a conductive layer on another dielectric layer (e.g., the signal path or ground plane). The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper.

The filter may include one or more capacitors that have a small capacitive area (e.g., overlapping area between electrodes). For example, in some embodiments the capacitive area of the capacitor may be less than about 0.05 square millimeters ($mm^2$), in some embodiments less than about 0.04 $mm^2$, in some embodiments less than about 0.03 $mm^2$, in some embodiments less than about 0.02 $mm^2$, and in some embodiments less than about 0.015 $mm^2$.

The filter may exhibit excellent performance characteristics, such as low insertion loss for frequencies within a pass band frequency range of the filter. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the filter may exhibit excellent rejection of frequencies outside the pass band frequency range. In some embodiments, the insertion loss for frequencies outside the pass band frequency range may be less than about −15 dB, in some embodiments less than about −25 dB, in some embodiments less than about −35 dB, and in some embodiments less than about −40 dB.

Additionally, the filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The filter may also exhibit consistent performance characteristics (e.g., insertion loss, return loss, etc.) across a wide range of temperatures. In some embodiments, the insertion loss of the filter may vary less than 5 dB or less across large temperature ranges. For example, the filter can exhibit a first insertion loss at about 25° C. and at a first frequency. The filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

The filter may have an overall length that ranges from about 0.5 mm to about 30 mm, in some embodiments, from about 1 mm to about 15 mm, and in some embodiments from about 2 mm to about 8 mm.

The filter may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The filter may generally be low-profile or thin. For example, in some embodiments, the filter may have an overall thickness that ranges from about 100 microns to about 2 mm, in some embodiments from about 150 microns to about 1 mm, and in some embodiments from about 200 microns to about 300 microns.

Regardless of the particular configuration employed, the present inventors have discovered that through selective control over the dimensions and arrangement of one or more vias, a via assembly can be achieved in a multilayer filter that provides low inductance. The via assembly may allow the multilayer filter to achieve more desirable performance characteristics (e.g., higher frequency performance) and/or allow for greater customization or control over the performance characteristics of the multilayer filter.

The via assembly(s) may include at least one via and may provide vertical electrical connections between conductive layers (e.g., inductors, capacitors, and/or portion of the signal path) formed within the multilayer filter without exhibiting high levels of unwanted inductance (e.g., parasitic inductance) that would otherwise undesirably affect the performance characteristics of the filter. For example, the multilayer filter may include a dielectric layer having a top surface and a bottom surface. The dielectric layer may have a thickness in a Z-direction between the top surface and the bottom surface and a conductive layer formed on the top surface. The via assembly may be formed in the dielectric layer and connected to the conductive layer on the top surface of the dielectric layer. The via assembly may extend to the bottom surface of the dielectric layer. The via assembly may be connected at the bottom surface of the dielectric layer with another conductive layer (e.g., a ground plane, an inductor, a capacitor, and/or a portion of the signal path).

The via assembly may have a length in the Z-direction and a total cross-sectional area in an X-Y plane that is perpendicular to the Z-direction. An area-to-squared-length ratio may be defined as a ratio of the total cross-sectional area of the via assembly to the length of the via assembly squared.

The area-to-squared-length ratio of the via assembly may be greater than about 3.25, in some embodiments greater than about 3.5, in some embodiments greater than about 4, in some embodiments greater than about 5, in some embodiments greater than about 7, in some embodiments greater than about 10, in some embodiments greater than about 15, in some embodiments greater than about 20, in some embodiments greater than about 40, in some embodiments greater than about 60, and in some embodiments greater than about 100.

The via assembly may be used to connect an inductor or capacitor electrode with a ground plane or another portion of a signal path formed between an input and output of the filter. For example, in some embodiments, the multilayer filter may include a ground plane, and the via assembly may be connected at the bottom surface of the dielectric layer with the ground plane. The conductive layer may form or include an inductor or an electrode of a capacitor.

The via assembly may include a plurality of vias. The total cross-sectional area may include or be defined as equal to the sum of respective cross-sectional areas of the plurality of vias in the X-Y plane. For example, in some embodiments, the plurality of vias may be arranged in a repeating pattern, such as a grid. In some embodiments, the grid may be or include an m×n grid. The integers m and n may each equal two or greater. For example, in some embodiments, the via assembly may be arranged in a 1×3 grid, 2×3 grid, a 3×3 grid, a 2×4 grid, a 4×4 grid, or larger. In some embodiments, m and/or n may range from 1 to about 100, or more, in some embodiments from 1 to about 50, in some embodiments from 1 to about 25, in some embodiments from 1 to about 20, in some embodiments from 1 to about 15, in some embodiments from 1 to about 10, in some embodiments from 1 to about 5, and in some embodiments from 1 to about 3.

In some embodiments, the plurality of vias may be approximately evenly spaced apart in at least one of an X-direction or a Y-direction (or in each of the X-direction and the Y-direction). The X-direction and Y-direction may lie in the X-Y plane, and the X-direction may be perpendicular to the Y-direction.

The plurality of vias may have approximately equal respective cross-sectional areas. However, in other embodiments, at least one of the plurality of vias may have a cross-sectional area that is greater than at least another of the plurality of vias.

The plurality of vias may be spaced apart by a spacing distance that is less than about 200 microns, in some embodiments less than about 150 microns, in some embodiments less than about 120 microns, in some embodiments less than about 100 microns, in some embodiments, less than about 80 microns, and in some embodiments less than about 60 microns, e.g., about 50 microns, or less.

A width-to-spacing ratio may be defined as a ratio of a width in the X-Y plane of at least one of the vias to the spacing distance between at least two of the vias (e.g., a shortest spacing distance). Alternatively, the width-to-spacing ratio may be defined as a ratio of an average of respective widths of the vias in the X-Y plane to an average spacing distance between the vias of in the X-Y plane. The width-to-spacing ratio may be greater than about 1, in some embodiments greater than about 1.25, in some embodiments greater than about 1.5, in some embodiments greater than about 1.75, in some embodiments greater than about 2, in some embodiments greater than about 2.5, in some embodiments greater than about 3, in some embodiments greater than about 4, and in some embodiments greater than about 5.

In some embodiments, the via assembly may include at least one filled via. Such filled vias may include a solid vertical column of conductive material. In some embodiments, the via assembly may include at least one unfilled via. Such unfilled vias may include a layer of conductive material formed on an inner surface of a hole formed in the dielectric layer. A hallow space or cavity may be defined in at least a portion of the unfilled via such that the unfilled via is not completely filled with conductive material. In some embodiments the via assembly may include only filled vias, only unfilled vias, or a mixture of filled vias and unfilled vias.

In some embodiments, the via assembly may include or consist of a single via. The total cross-sectional area of the via assembly may equal the cross-sectional area of the single via. Without being bound by theory, a single via may provide a larger total cross-sectional area in a smaller footprint. As a result, the single via may provide greater current and/or power handling capability. However, multiple vias may provide a greater surface area than a single via. For alternating current, a large portion of the electrical current travels near the surface of conductors (e.g., vias), according to the "skin effect." As a result, the conductivity of conductors can increase with increased surface area. Thus, multiple vias may provide a higher conductivity (e.g., lower resistance) via assembly than a single via.

In some embodiments, the via assembly may provide a large surface area while also having a relatively short length.

This combination may provide reduced inductance and increased conductivity. For example, in some embodiments the via assembly may have a surface-area-to-squared-length ratio that is defined as a ratio of the total surface area of the via assembly to the length of the vias assembly in the Z-direction squared. The surface-area-to-squared-length ratio may be greater than about 6.5, in some embodiments greater than about 7, in some embodiments greater than about 8, in some embodiments greater than about 9, in some embodiments greater than about 10, in some embodiments greater than about 15, in some embodiments greater than about 20, in some embodiments greater than about 30, in some embodiments greater than about 40, in some embodiments greater than about 50, and in some embodiments greater than about 60.

The via assembly may include vias having a variety of suitable cross-sectional shapes. For example, in some embodiments, the via assembly may include at least one via having a circular cross-sectional shape. In some embodiments, the via assembly may include at least one via having a rectangular cross-sectional shape. The via assembly may include only vias having circular cross-sectional shapes, only vias having rectangular cross-sectional shapes, or a mixture thereof. Additional example shapes include ovals, triangles, and any suitable polygonal shape.

At least some of the dielectric layers may have thicknesses that are less than about 180 microns, in some embodiments less than about 120 microns, in some embodiments less than about 100 microns in some embodiments less than about 80 microns, in some embodiments less than about 60 microns, in some embodiments less than about 50 microns, in some embodiments less than about 40 microns, in some embodiments less than about 30 microns, and in some embodiments less than about 20 microns.

The multilayer filter may include an additional dielectric layer having a top surface and a bottom surface and an intermediary conductive layer formed on the top surface. The dielectric layer may be arranged on the top surface of the additional dielectric layer. The via assembly may include at least one via formed in the additional dielectric layer and connected with the intermediary conductive layer. In some embodiments, the length of the via assembly in the Z-direction may include a length of the via(s) formed in the additional dielectric layer.

The via assembly may have a length that is less than about 500 microns, in some embodiments less than about 300 microns, in some embodiments less than about 200 microns, in some embodiments less than about 150 microns, in some embodiments less than about 120 microns, in some embodiments less than about 100 microns, in some embodiments less than about 80 microns, in some embodiments less than about 60 microns, in some embodiments less than about 40 microns, e.g., about 20 microns.

The via(s) may have a variety of suitable widths. For example, in some embodiments, the width of the via may range from about 20 microns to about 200 microns, in some embodiments from about 40 microns to about 180 microns, in some embodiments from about 60 microns to about 140 microns, and in some embodiments from about 80 microns to about 120 microns.

I. Multilayer Filter

FIG. 1 is a simplified schematic of a multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
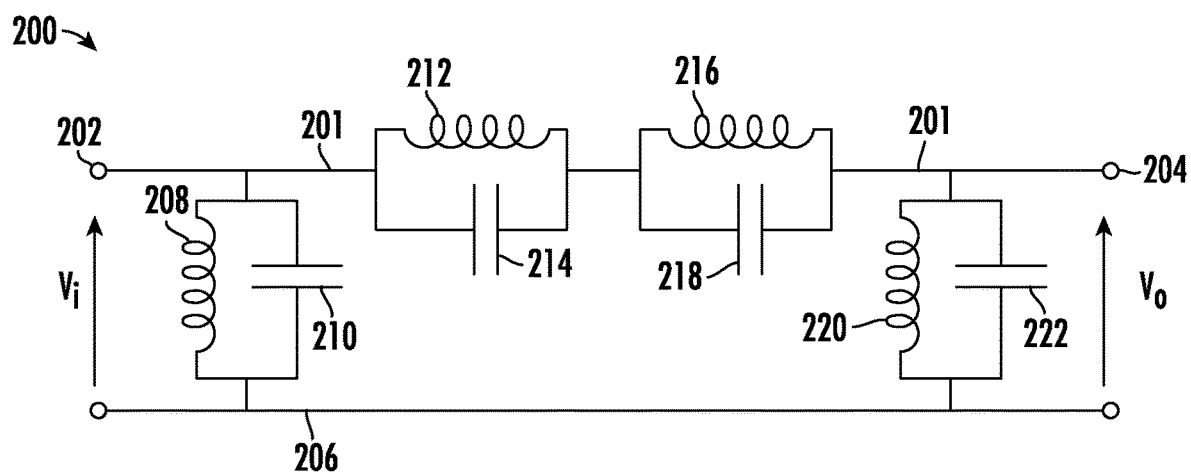
FIG. 2 is a simplified schematic of another band pass filter according to aspects of the present disclosure.

FIG. 2 is a schematic of an example embodiment of a band pass filter 200 according to aspects of the present disclosure. A signal path 201 may be defined between an input 202 and an output 204 of the filter 200. An input voltage (represented by $V_i$ in FIG. 1) may be input to the filter 200 between the input 202 and a ground 206 of the filter 200. An output voltage (represented by $V_o$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 210 and third capacitor 214 electrically connected in parallel with each other. The third inductor 210 and third capacitor 214 may be electrically connected between the signal path 201 and the ground 206. The third inductor 210 and third capacitor 214 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired band pass frequency range of the band pass filter 200. The band pass filter 200 may significantly reduce frequencies outside of the passband frequency range while allowing frequencies within a passband frequency range to be transmitted through the filter 200 substantially unaffected.

Figure 3A:
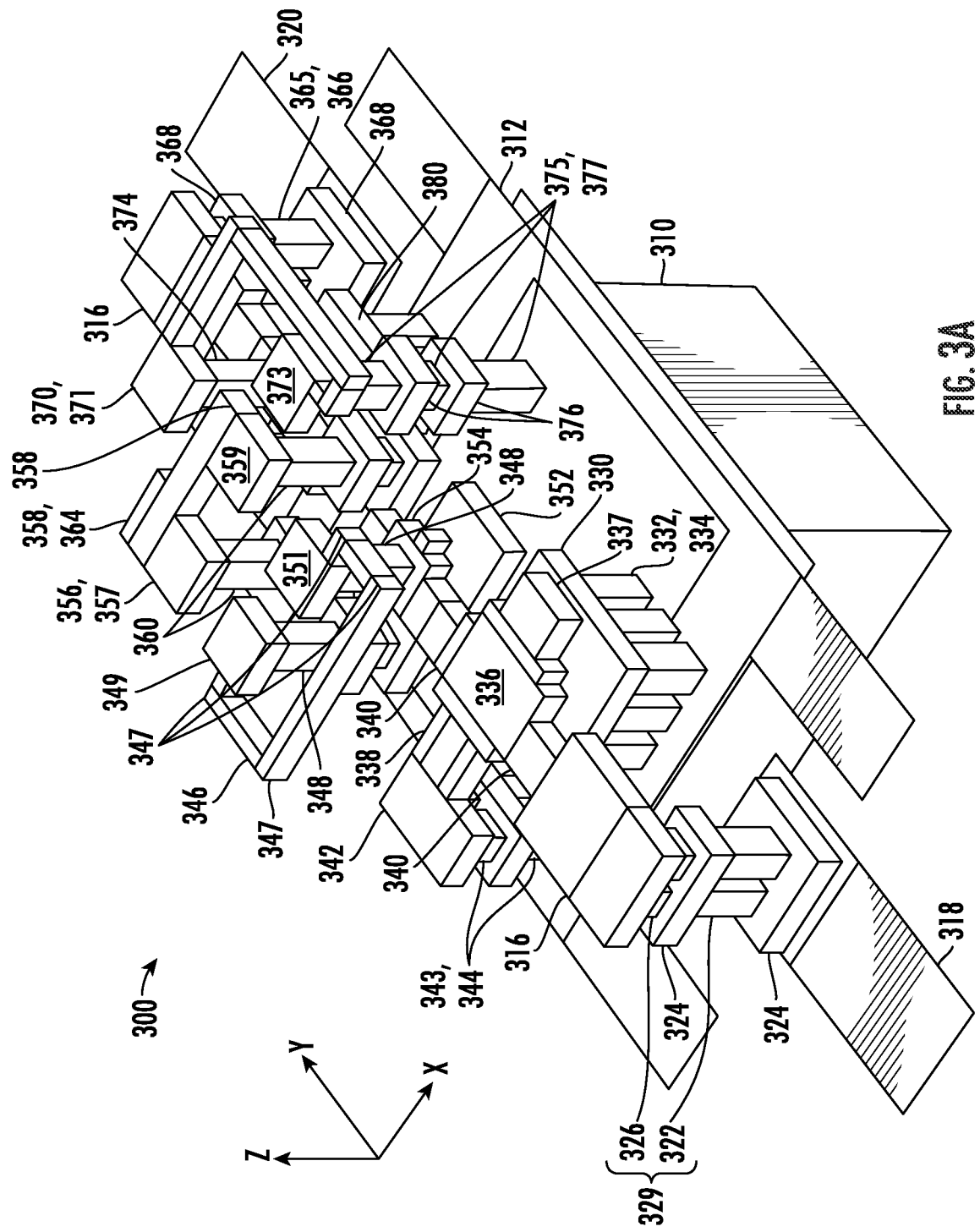
FIGS. 3A and 3B are perspective views of an example band pass filter according to aspects of the present disclosure.
Figure 3B:
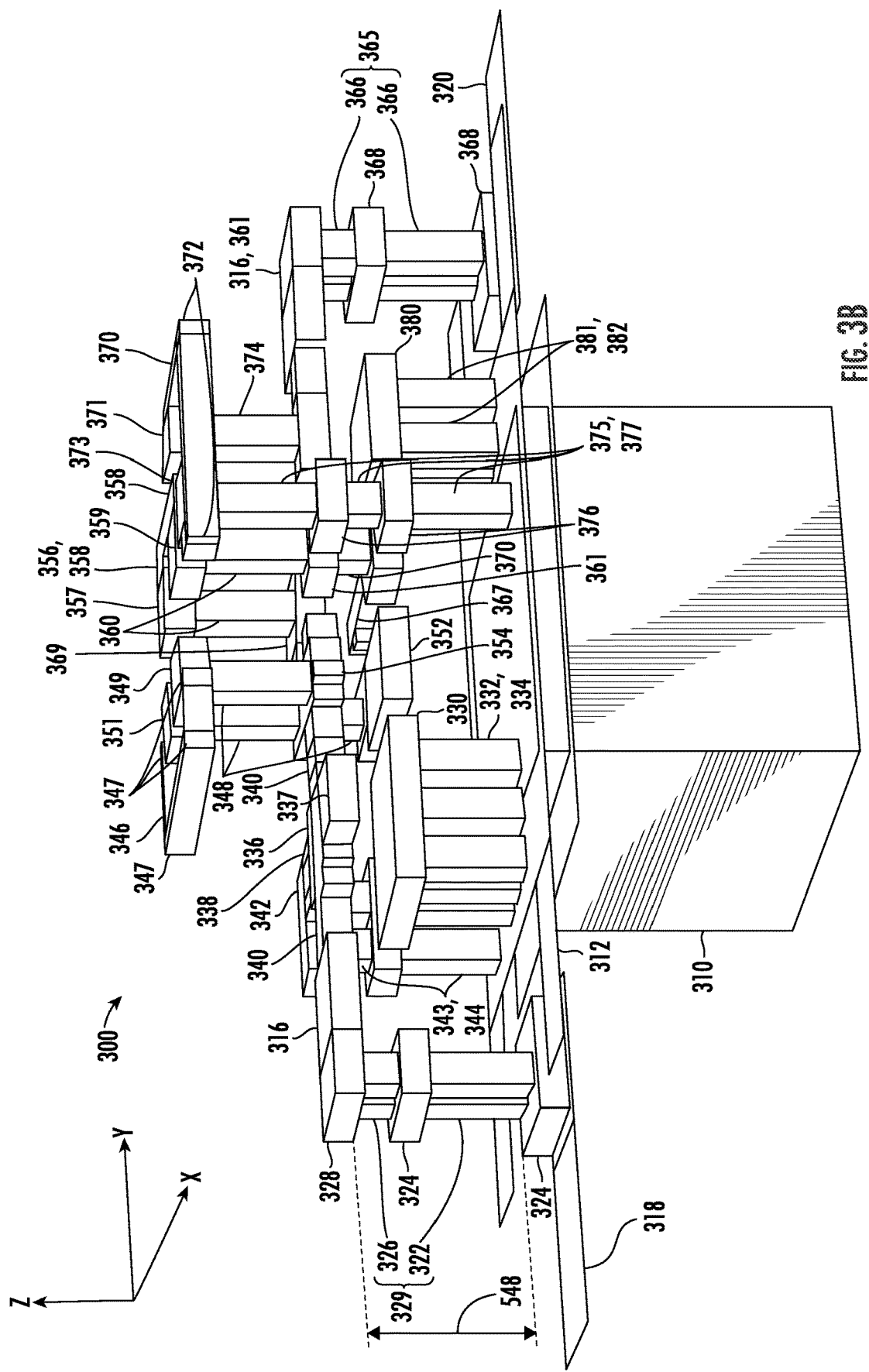
Figure 3C:
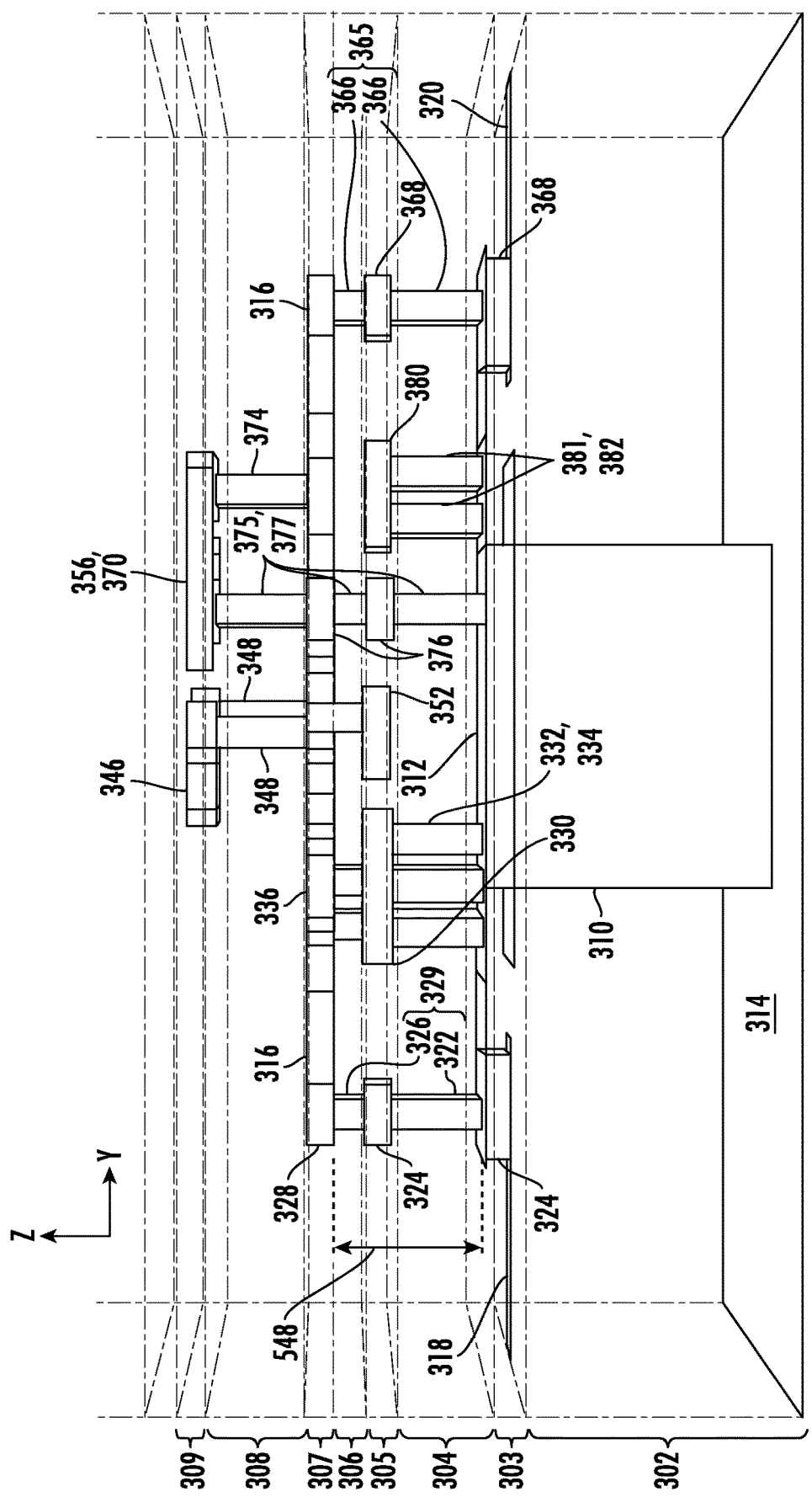
FIG. 3C is a side elevation view of the filter of FIGS. 3A and 3B.

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed on the dielectric layers 304, 306, 308. Conductive layer 303 may be formed on a bottom surface of the first dielectric layer 304. Conductive layers 305, 307 may be formed on a top surface and a bottom surface, respectively, of the second dielectric layer 306. A ground may include a ground plane 312 that is exposed and/or terminated along a bottom surface of the filter 300 (the bottom surface of conductive layer 303. The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the first dielectric layer 302, ground electrode 310, and the first conductive layer 303. FIG. 4B illustrates the ground plane 312 formed on the first dielectric layer 302. FIG. 4C additionally illustrates the conductive layer 305 formed on the second dielectric layer 304. FIG. 4D additionally illustrates conductive layer 307 that is formed on the third dielectric layer 306. FIG. 4E illustrates the conductive layer 309 formed on the fourth layer 308. The dielectric layers 302, 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 may electrically connecting the input 318 with an intermediary conductive layer 324 disposed between the first layer 304 and second layer 306. The signal path 316 may include one or more vias 326 electrically connecting the intermediary layer 324 with a conductive layer 328 formed on the second dielectric layer 306.

A first capacitor may be formed between a portion 336 of the signal path 316 formed on an upper surface of the second layer 360 and a conductive layer 330 formed on a lower surface of the second layer 306 of dielectric material. The first capacitor of the filter 300 may correspond with the first capacitor 210 of the circuit diagram 200 of FIG. 2. The conductive layer 330 (e.g., capacitor electrode) may be capacitively coupled with a portion 336 of the signal path 316. The conductive layer 330 may be spaced apart from the portion 336 of the signal path 316 in a Z-direction. The conductive layer 330 may be electrically connected with the ground plane 312 by a second via assembly 332, which may include one or more vias 334. The vias 334 of the second via assembly 332 may be arranged in a 3×3 grid.

The first capacitor may be insensitive to relative misalignment of the electrodes of the first capacitor, which may be described as being "self-aligning." As best seen in FIG. 4D, the portion 336 of the signal path 316 may generally be dimensionally smaller (e.g., in the X- and Y-directions) than the conductive layer 330 of the first capacitor. Additionally, the portion 336 of the signal path 316 may define connections in the X-Y plane with other elements and other parts of the signal path 316. Such connections may be sized such that a slight misalignment in the X-direction or Y-direction does not change a capacitive area of the first capacitor. More specifically, a size of an effective overlap area (e.g., in the X-Y plane) between the conductive layer 330 and the portion 336 of the signal path 316 may be insensitive to slight misalignment in the X-direction or Y-direction of the second and third layers 304, 306.

For example, the portion 336 of the signal path 316 may include a tab 337 (e.g., extending in the X-direction) that has a width (e.g., in the Y-direction) equal to a width (e.g., in the Y-direction) of the connector portion 338 on an opposite side of the portion 336. Similarly, connections 340 may extend from opposite sides of the portion 336 (e.g., in the Y-direction) that may have equal widths. As a result, relative misalignment in the Y-direction may not alter the overlapping area between the conductive layer 330 and the portion 336 of the signal path 316.

The filter 300 may include a first inductor 342 electrically connected with the signal path 316 and ground plane 312. The first inductor 342 of the filter 300 may correspond with the first inductor 208 of the circuit diagram 200 of FIG. 2. The first inductor 342 may be connected with the portion 336 of the signal path 316 that forms the first capacitor by connector portion 338. The first inductor 342 may be electrically connected with the ground plane 312 a third via assembly 343, which may include one or more vias 344 (best seen in FIG. 3B). The vias 344 of the third via assembly 343 may be arranged in a 2×1 grid.

The signal path 316 of the filter 300 may include a second inductor 346, which may correspond with the second inductor 212 of the circuit diagram 200 of FIG. 2. The second inductor 346 may be formed on the fourth layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the first inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the first inductor 346 may form greater than half of a "loop."

The second capacitor may be formed between the conductive layer 352 (e.g., capacitor electrode) and the portion 354 of the signal path 316. The second capacitor may correspond with the second capacitor 214 of the circuit diagram 200 of FIG. 2. The second capacitor may be a self-aligning capacitor. As best seen in FIG. 4D, the portion 354 of the signal path 316 may be shaped such that a size of a capacitive area (e.g., overlapping area in the X-Y plane) between the conductive layer 352 and the portion of the signal path 316 is insensitive to small misalignment between the second layer 304 and the third layer 306.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by a fourth via assembly 365, which may include one or more vias 366 connected with one or more intermediary layers 368. In other words, the third inductor 356 may form a portion of the signal path 316 between the second inductor 346 and the output 320. The vias 366 of the fourth via assembly 365 may be arranged in a 2×1 grid.

The third inductor 356 may include a line width addition 364. The line width addition 364 may include a portion of the conductive material that forms the third inductor 356. The line width addition 364 may extend across at least a portion of the third inductor such that the third inductor 356 has a greater width at the line with addition 364 than other parts of the third inductor 356.

A third capacitor may be formed in parallel with third inductor 356. The third capacitor may correspond with the third capacitor 214 of the circuit diagram 200 of FIG. 2. The third capacitor of the filter 300 may include a conductive layer 367 (e.g., capacitor electrode) that is capacitively coupled with the portion 369 (best seen in FIG. 4D) of the signal path 316. The third capacitor may be a self-aligning capacitor such that the size of the capacitive area is insensitive to relative misalignment between the second and third dielectric layers 304, 306.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2 The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 (e.g., capacitor electrode) that is capacitively coupled with the portion 361 of the signal path 316 that is connected with the output 320. The conductive layer 380 of the fourth capacitor may be electrically connected with the ground plane 312 by a sixth via assembly 381, which may include one or more vias 382. The vias 382 of the sixth via assembly 381 may be arranged in a 3×2 grid. The fourth capacitor may correspond with the fourth capacitor 222 of the circuit diagram 200 of FIG. 2. The fourth capacitor may be self-aligning, for example as described above with reference to the first capacitor.

II. Via Assembly

Figure 5A:
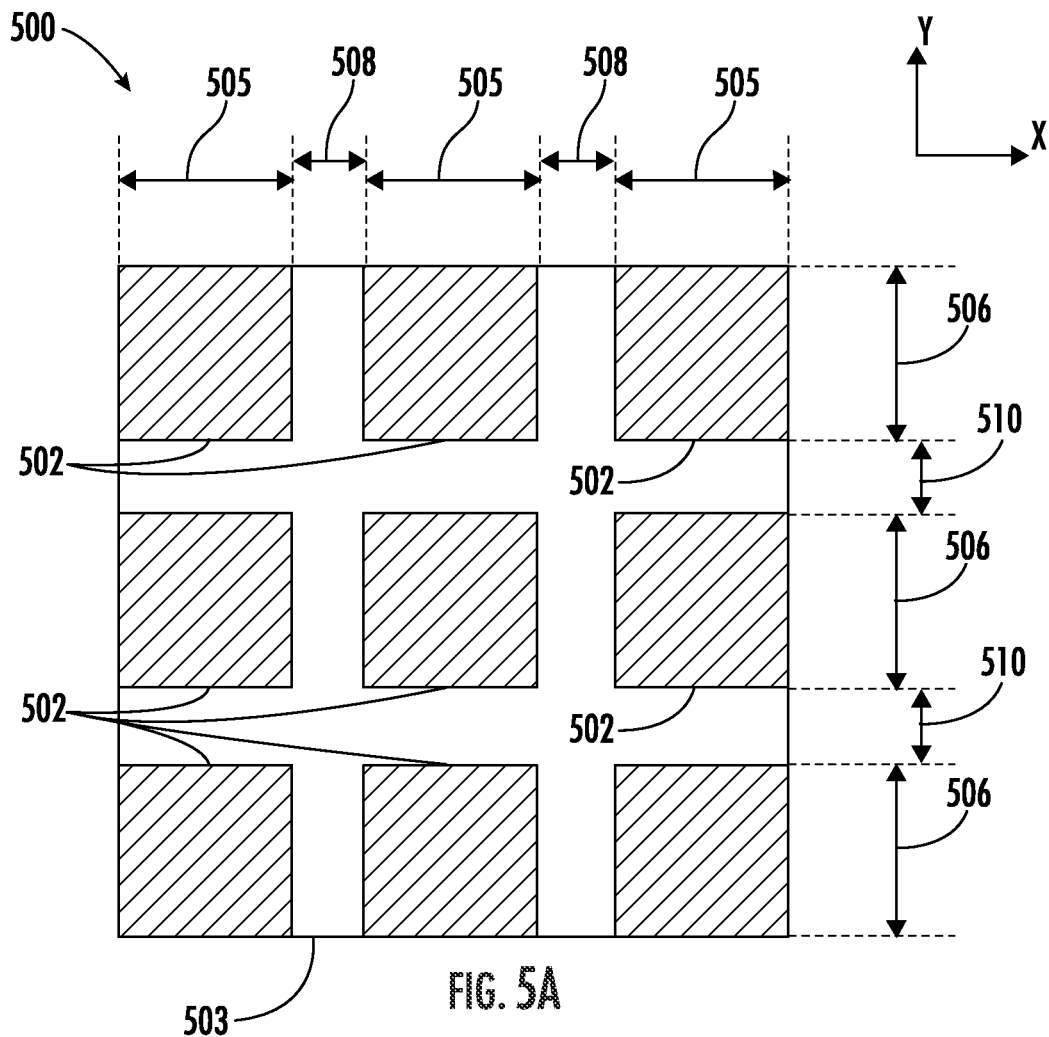
FIGS. 5A and 5B are top down and side elevation views, respectively, of an embodiment of a via assembly in which vias are arranged in a grid and have rectangular cross-sectional shapes according to aspects of the present disclosure.
Figure 5B:
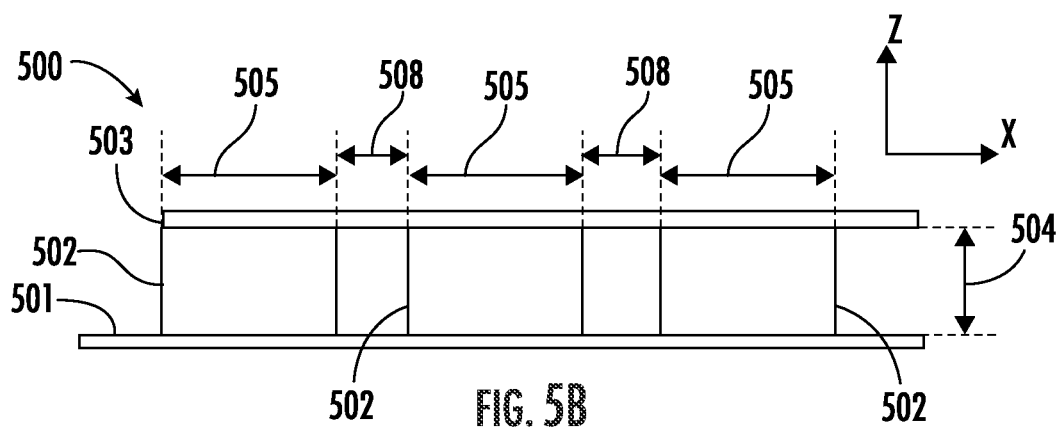

FIG. 5A is a top down view of one embodiment of a via assembly 500 according to aspects of the present disclosure. The via assembly 500 may correspond with the second via assembly 332, described above with reference to FIGS. 3 through 4E. The via assembly 500 may include a plurality of vias 502. FIG. 5B is a side elevation view of the via assembly 500 of FIG. 5A. The vias 502 may be connected between a conductive layer 503 that forms a capacitor electrode and a ground plane 501. The conductive layer 503 may correspond with the conductive layer 330 described above with reference to FIGS. 3A through 4E.

The vias 502 may have respective cross-sectional areas in the X-Y plane (represented by cross hatching in FIG. 5A). The via assembly 500 may have a total cross-sectional area in the X-Y plane, which may include (e.g., be defined as equal to) the sum of the respective cross-sectional areas of the plurality of vias 502.

Referring to FIG. 5B, the via assembly 500 may have a length 504 in the Z-direction. An area-to-squared-length ratio may be defined as follows:

$$\frac{A}{L^2}$$

where L represents the length 504 of the via assembly in the Z-direction, and A represents the total cross-sectional area of the via assembly 504 in the X-Y plane (represented by cross hatching in FIG. 5A). The area-to-squared-length ratio may be greater than about 3.25.

In some embodiments, the vias 502 may be arranged in a grid comprising a repeating pattern. For example, the vias 502 may be arranged in an m×n grid. In this example, m and n each equal 3. The vias 502 may be rectangular (e.g., square) in cross-sectional shape. The vias 502 may have approximately equal widths 505 in the X-direction and/or equal widths 506 in the Y-direction. However, in some embodiments the widths 505 in the X-direction may be different than the widths 506 in the Y-direction. Moreover, in some embodiments the vias 502 may have a variety of widths 505, 506 in the X-direction and Y-direction.

In some embodiments, the vias 502 may be approximately evenly spaced apart in the X-direction and/or the Y-direction. For example, an X-spacing distance 508 may be defined in the X-direction. A Y-spacing distance 510 may be defined in the Y-direction between each pair of vias 502. In some embodiments, the X-spacing distances 508 may be equal to each other. In some embodiments, the Y-spacing distances 508 may be equal to each other. In some embodiments, each of the X-spacing distances 508 may be equal to each of the Y-spacing distances 510.

A width-to-spacing ratio may be defined between the width 505 in the X-direction and the X-spacing distance 508 and/or between the width 506 in the Y-direction and the Y-spacing 510. As indicated above, in some embodiments, the widths 505, 506 may be approximately equal to each other and the spacing distances 508, 510 may be approximately equal to each other. Alternatively, the width-to-spacing ratio may be defined as a ratio of an average of respective widths of the vias 502 in the X-Y plane to an average spacing distance between the vias 502 in the X-Y plane. The width-to-spacing ratio may be greater than about 1.

FIG. 5C is a top down view of another embodiment of the via assembly 512 according to aspects of the present disclosure. FIG. 5D is a side elevation view of the via assembly 512 of FIG. 5C. The via assembly 512 may include a plurality of vias 514. As shown in FIG. 5C, the vias 514 may have a cylindrical cross-sectional area. X- and Y-spacing distances 516, 518 may be defined at the narrowest gaps between the vias 514 in the X-direction and Y-direction, respectively.

Figure 5E:
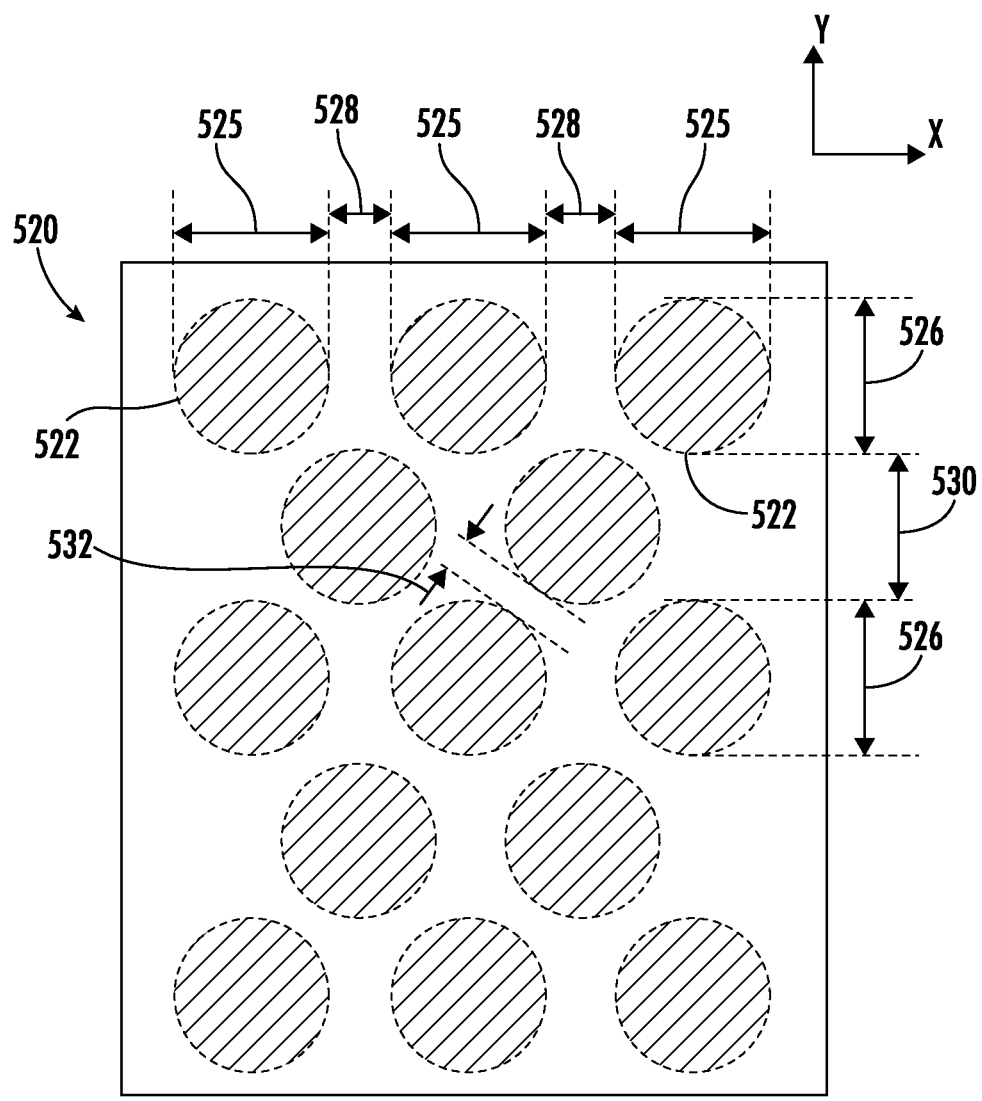
FIGS. 5E and 5F are top down and side elevation views, respectively, of another embodiment of a via assembly in which vias are arranged in a repeating pattern and have circular cross-sectional shaped according to aspects of the present disclosure.
Figure 5F:
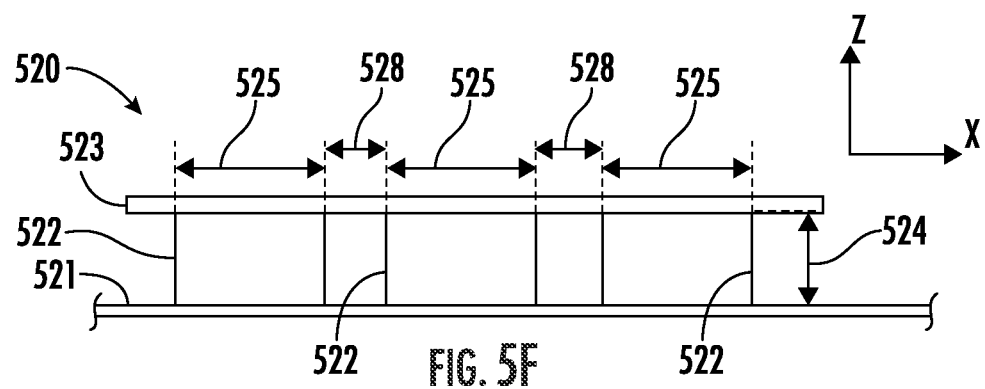

FIG. 5E is a top down view of another embodiment of a via assembly 520 according to aspects of the present disclosure. FIG. 5D is a side elevation view of the via assembly 520 of FIG. 5E. The via assembly 520 may include a plurality of vias 522. As shown in FIG. 5E, the vias 522 may have a cylindrical cross-sectional area. The X- and Y-spacing distances 528, 530 may be defined at the narrowest gaps between the vias 522 in the X-direction and Y-directions, respectively.

As illustrated in FIG. 5E, the vias 522 may be arranged in a repeating pattern. However, the vias 522 may not be aligned in rows and columns with respect to the X- and Y-directions. Rather, the vias 522 may be arranged in any suitable repeating pattern, including uniform packing patterns. Examples of suitable patterns include triangular, elongated triangular, hexagonal, square, snub square, etc.

Additionally, in such embodiments, a spacing distance 532 may be defined as the shortest distance between the vias 522 (e.g., at any point in the repeating pattern) in any direction in the X-Y plane, which may not necessarily be solely in the X- or Y-direction.

Figure 5G:
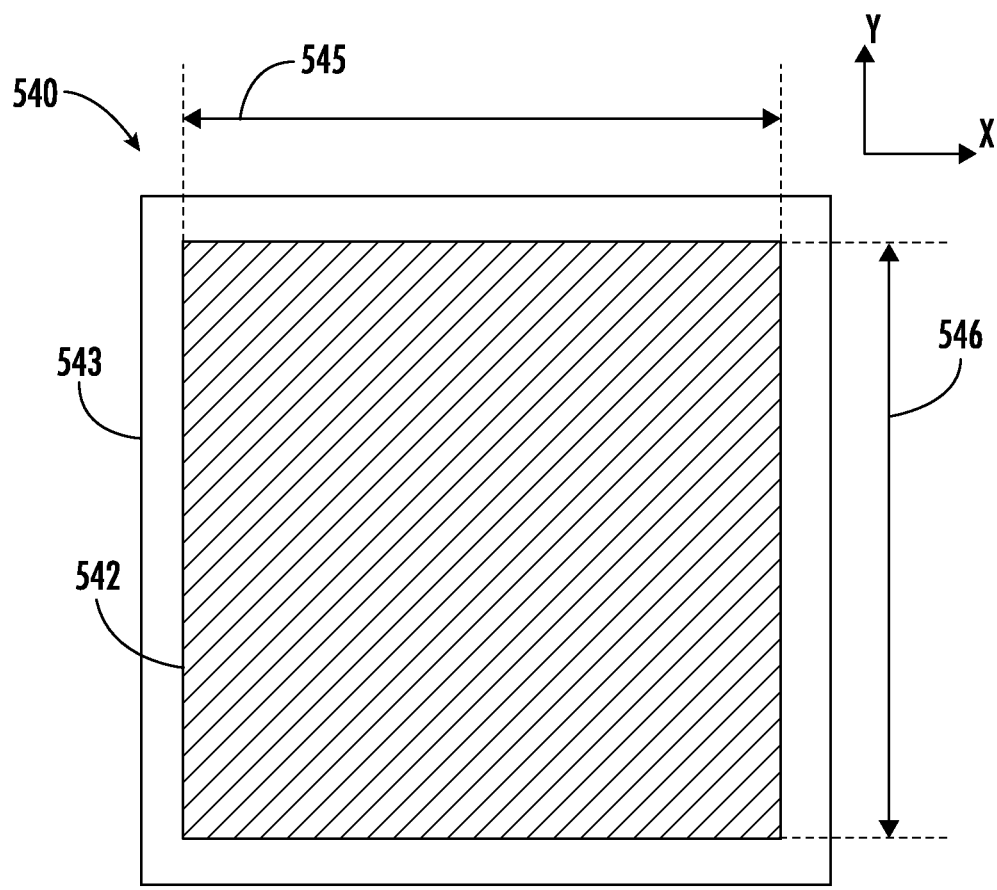
FIGS. 5G and 5H are top down and side elevation views, respectively, of another embodiment of a via assembly that includes a single via according to aspects of the present disclosure.
Figure 5H:
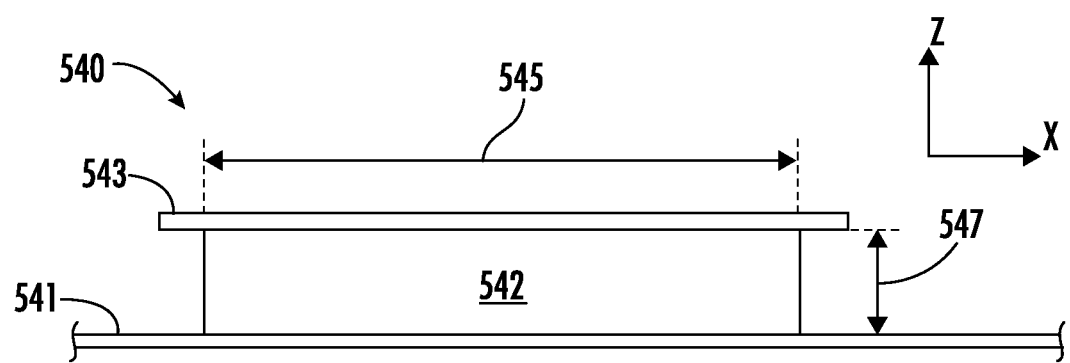

FIG. 5G is a top down view of another embodiment of a via assembly 540 according to aspects of the present disclosure. FIG. 5H is a side elevation view of the via assembly 540 of FIG. 5G. The via assembly 540 may include or consist of a single via 542. The single via 542 may connect a conductive layer 542 with a ground plane 541. The total cross-sectional area of the via assembly 540 may be defined as the cross-sectional area of the single via 542 in the X-Y plane (indicated by cross hatching in FIG. 5G). The via assembly 540 may have a width 545 in the X-direction and a width 546 in the Y-direction. The via assembly may have a length 547 in the Z-direction. It should be understood that the single via may have any suitable cross-sectional shape, including circular.

Without being bound by theory, the via assembly 540 including the single via 542 may provide a larger total cross-sectional area in a smaller footprint than the via assemblies 500, 520 described above with reference to FIGS. 5A through 5F. As a result, the single via assembly 540 may provide greater peak current and/or power handling capability. However, the via assemblies 500, 520 including multiple vias 502, 522 may provide greater surface areas than the single via assembly 540. When a conductor (e.g., via) is exposed to alternating current, a large portion of the alternating current travels near the surface of conductor, according to the "skin effect." As a result, the conductivity of such conductors can increase with increased surface area. The via assemblies 500, 520 including multiple vias 502, 522 may provide greater surface area than the single via assembly 540. Thus, via assembly 500, 520 including multiple vias 502, 522 may provide higher conductivity (e.g., lower resistance) than the single via assembly 540 while still providing low inductance.

A surface-area-to-squared-length ratio may be defined as the total surface area of the via assembly 500, 520, 540 divided the length 504, 524, 544 in the Z-direction of the via assembly 500, 520, 540 squared. In some embodiments the via assembly 500, 520, 540 may have a surface-area-to-squared-length ratio that is greater than about 6.5.

As indicated above, in some embodiments, a via assembly may include at least one via formed in an additional dielectric layer and connected with an intermediary conductive layer. For example, referring again to FIGS. 3B and 3C, the first via assembly 329 may include a pair of vias 326 formed in the third dielectric layer 306 and a pair of vias 322 formed in the second dielectric layer 304. The via assembly 329 may have a length 548 in the Z-direction that includes respective lengths of the both pairs of vias 322, 326.

III. Additional Example Embodiments

Figure 6A:
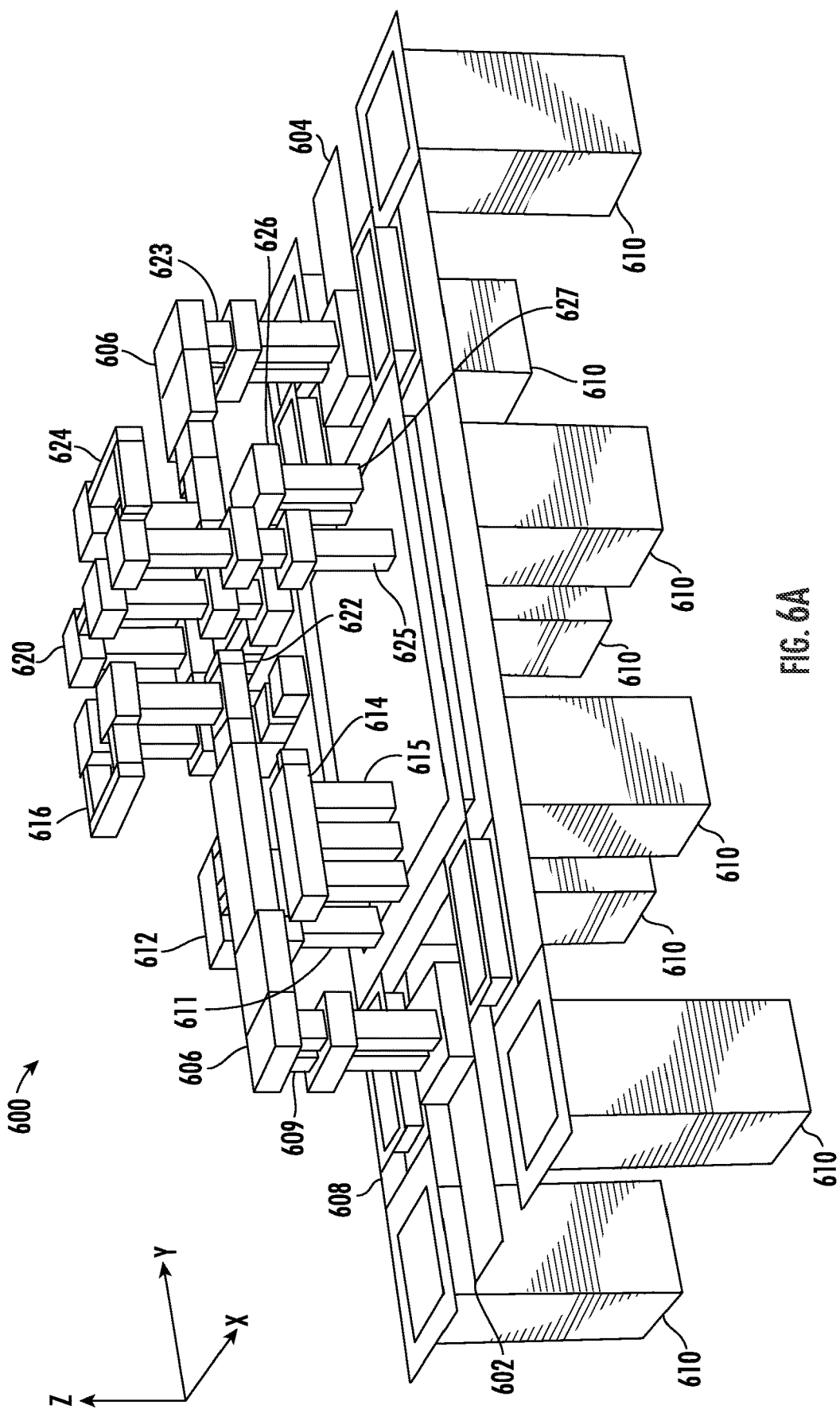
FIGS. 6A and 6B are perspective views of another embodiment of a multilayer filter according to aspects of the present disclosure.
Figure 6B:
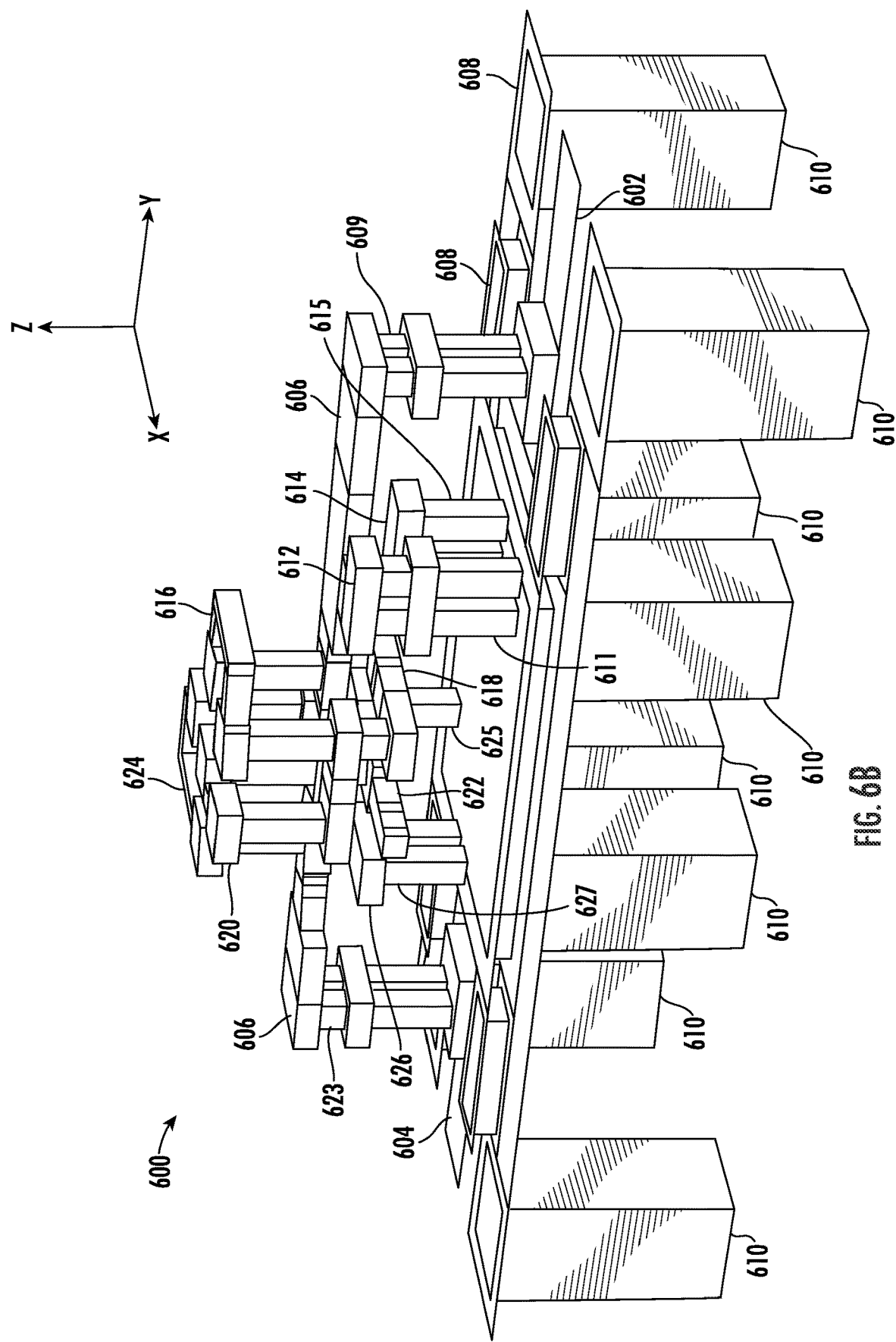

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5H. The filter 600 may include an input 602, an output 604, and a signal path 606 connecting the input 602 and the output 604. The filter 600 may also include a ground plane 608 electrically connected with one or more ground electrodes 610.

The filter 600 may include a first via assembly 609 connecting a portion of the signal path 606 on the third dielectric layer 636 with the input 602. The filter 600 may include a first inductor 612 that is electrically connected with the ground plane 608 by a third via assembly 611. The first inductor 612 may correspond with the first inductor 208 of the circuit diagram 200 described above with reference to FIG. 2. The filter 600 may include a first capacitor 614 electrically coupled with the ground plane 608 by a second via assembly 615. The first capacitor 614 may correspond with the first capacitor 210 of the circuit diagram 200 described above with reference to FIG. 2. The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output 604. The filter 600 may include a third inductor 620 and third capacitor 622 that are connected in parallel with each other and may form a portion of the signal path 606 between the input 602 and the output 604 The third inductor 620 and third capacitor 622 may correspond with the third inductor 216 and third capacitor 218, respectively, of the circuit diagram 200 described above with reference to FIG. 2. A portion of the signal path 606 on the third dielectric layer 636 may be connected with the output 604 by a fourth via assembly 623. Lastly, the filter 600 may include a fourth inductor 624 and fourth capacitor 626 that are connected in parallel with each other and connected between the signal path 606 and the ground plane 608. The fourth inductor 624 may be connected with the ground plane 608 by a fifth via assembly 625. The fourth capacitor 626 may be connected with the ground plane 608 by a sixth via assembly 627. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias and/or via assemblies in a similar manner as described above with reference to FIGS. 3 through 5H. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure. Conductive layers 630, 634, 638, 642 may be formed on the dielectric layers 632, 636, 640. Conductive layer 630 may be formed on a bottom surface of the first dielectric layer 632. Conductive layers 634, 638 may be formed on a top surface and a bottom surface, respectively of the second dielectric layer 636. Conductive layer 642 may be formed on a top surface of the third dielectric layer 640.

FIGS. 7A through 7D are a series of sequential top down views of the filter 600 of FIGS. 6A through 6C in which an additional dielectric layer is shown in each Figure. More specifically, FIG. 7A illustrates the first dielectric layer 628 and conductive layers 630 formed thereon. The first conductive layers 630 may include the ground plane 608. As illustrated, the ground plane 608 may be formed of multiple conductive layers. FIG. 7B additionally illustrates the second conductive layer 634 formed on the second dielectric layer 632. The second conductive layer 634 may include the first capacitor 614, second capacitor 618, third capacitor 622 and forth capacitor 626. FIG. 7C additionally illustrates the third conductive layer 638 that is formed on the third dielectric layer 636. The third conductive layer 638 may include portions of the signal path 606 and the first inductor 612. FIG. 7D illustrates the fourth conductive layer 642 formed on the fourth dielectric layer 640. The fourth conductive layer 642 may include the second inductor 616, third inductor 622, and fourth inductor 624. The dielectric layers 628, 632, 636, 640 are transparent to show the relative relocations of the various patterned conductive layers 630, 634, 638, 642.

Figure 8A:
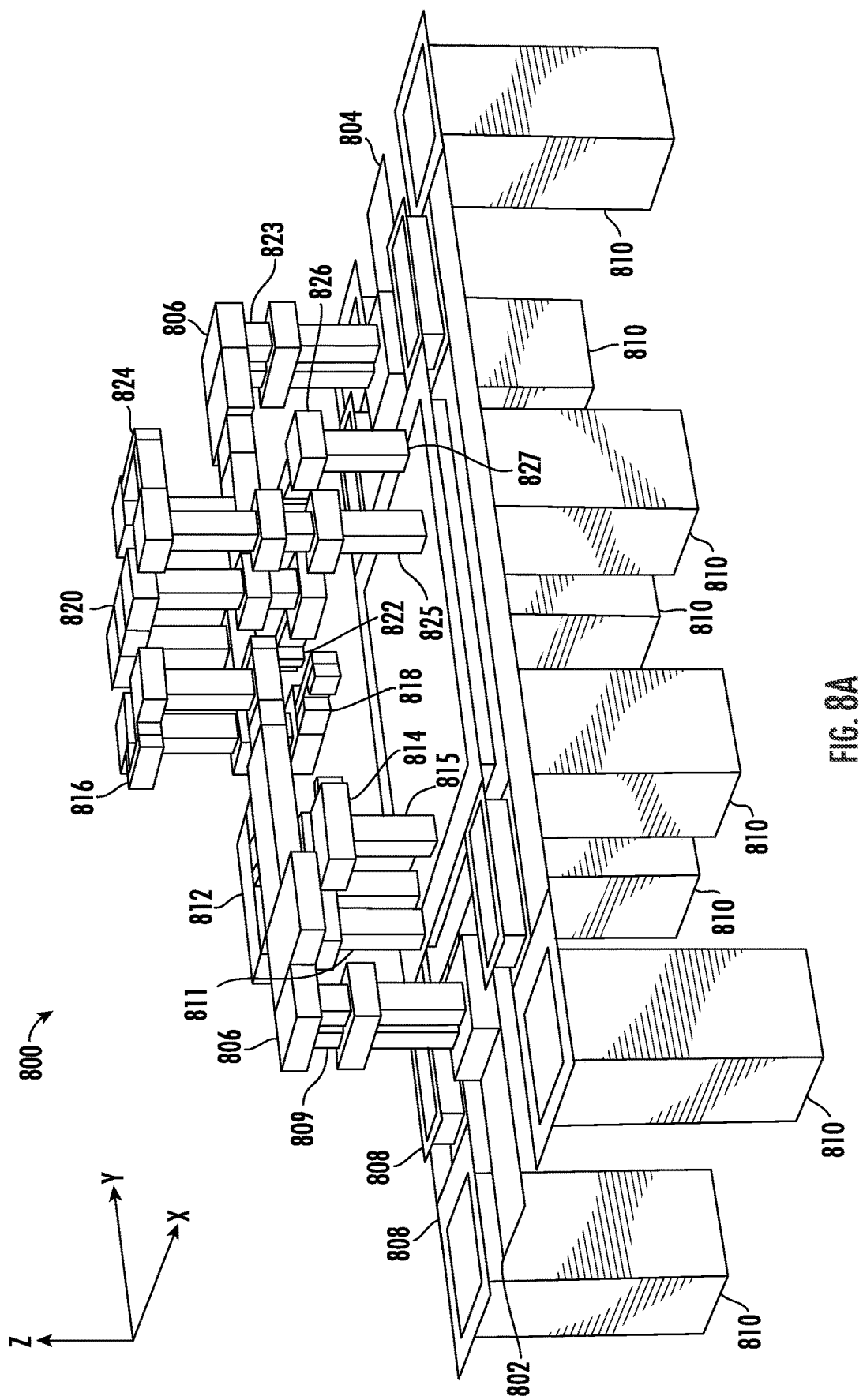
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5H. The filter 800 may include an input 802, an output 804, and a signal path 806 connecting the input 802 and the output 804. The filter 800 may also include a ground plane 808 electrically connected with one or more ground electrodes 810.

The filter 800 may include a first via assembly 809 connecting a portion of the signal path 806 on the third dielectric layer 836 with the input 802. The filter 800 may include a first inductor 812 that is electrically connected with the ground plane 808 by a third via assembly 811. The first inductor 812 may correspond with the first inductor 208 of the circuit diagram 200 described above with reference to FIG. 2. The filter 800 may include a first capacitor 814 electrically coupled with the ground plane 808 by a second via assembly 815. The first capacitor 814 may correspond with the first inductor capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. A portion of the signal path 806 on the third dielectric layer 836 may be connected with the output 804 by a fourth via assembly 823. Lastly, the filter 800 may include a fourth inductor 824 and fourth capacitor 826 that are connected in parallel with each other and connected between the signal path 806 and the ground plane 808. The fourth inductor 824 may be connected with the ground plane 808 by a fifth via assembly 825. The fourth capacitor 826 may be connected with the ground plane 808 by a sixth via assembly 827. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias and/or via assemblies in a similar manner as described above with reference to FIGS. 3 through 5H. Each of the inductors 812, 818, 820, 824 may be connected with the signal path 806 at a respective first location and connected with the signal path 806 or the ground plane 808 at a respective second location. Each of the inductors 812, 818, 820, 824 may have a respective effective length (e.g., in the X-Y plane) between the first location and the second location. Additionally, each of the inductors 812, 818, 820, 824 may have a respective width along its respective effective length.

Figure 8B:
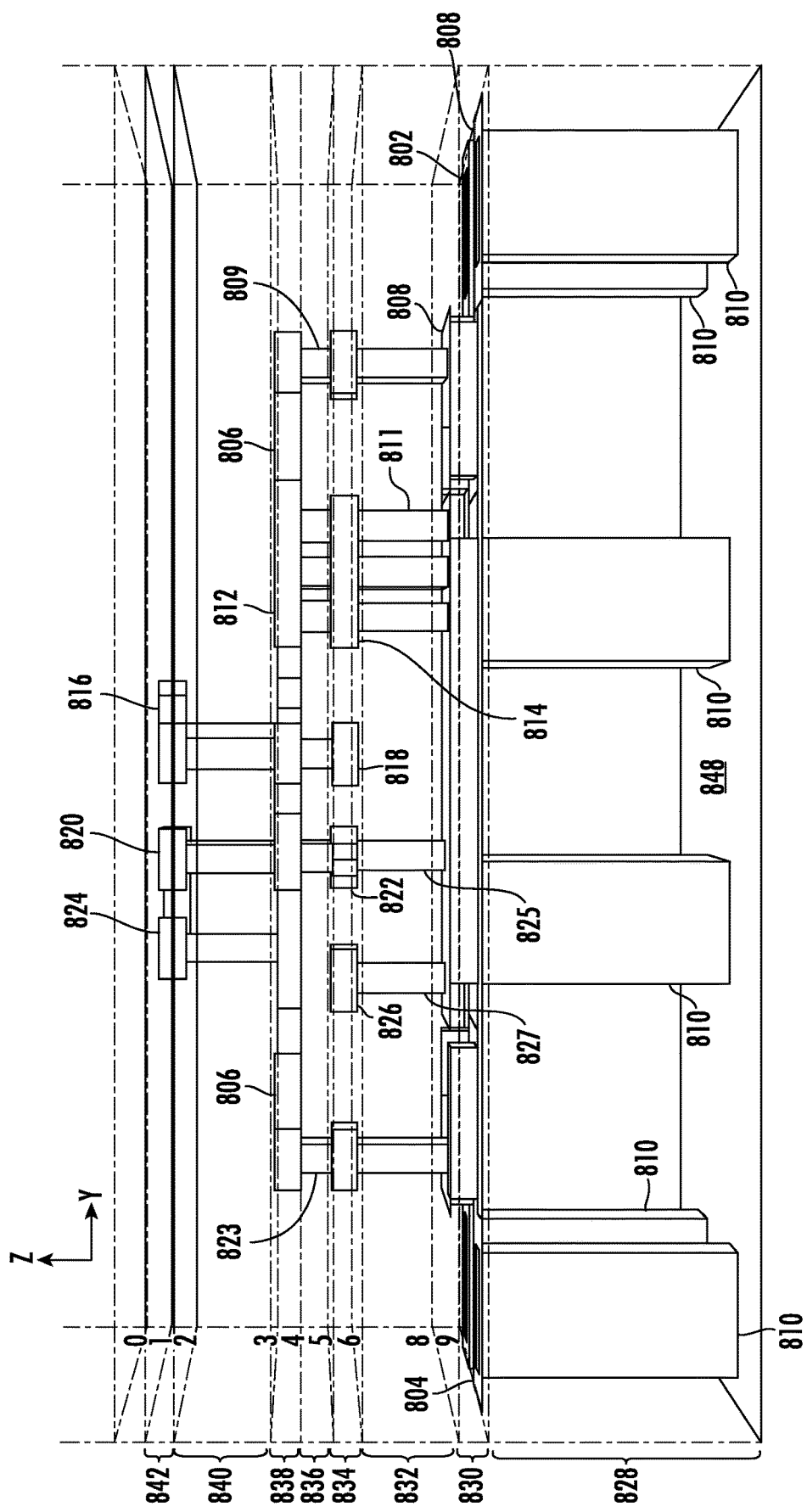
FIG. 8B is a side elevation view of the filter of FIG. 8A.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed on the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed on a top surface of the third dielectric layer 840.

Figure 9D:
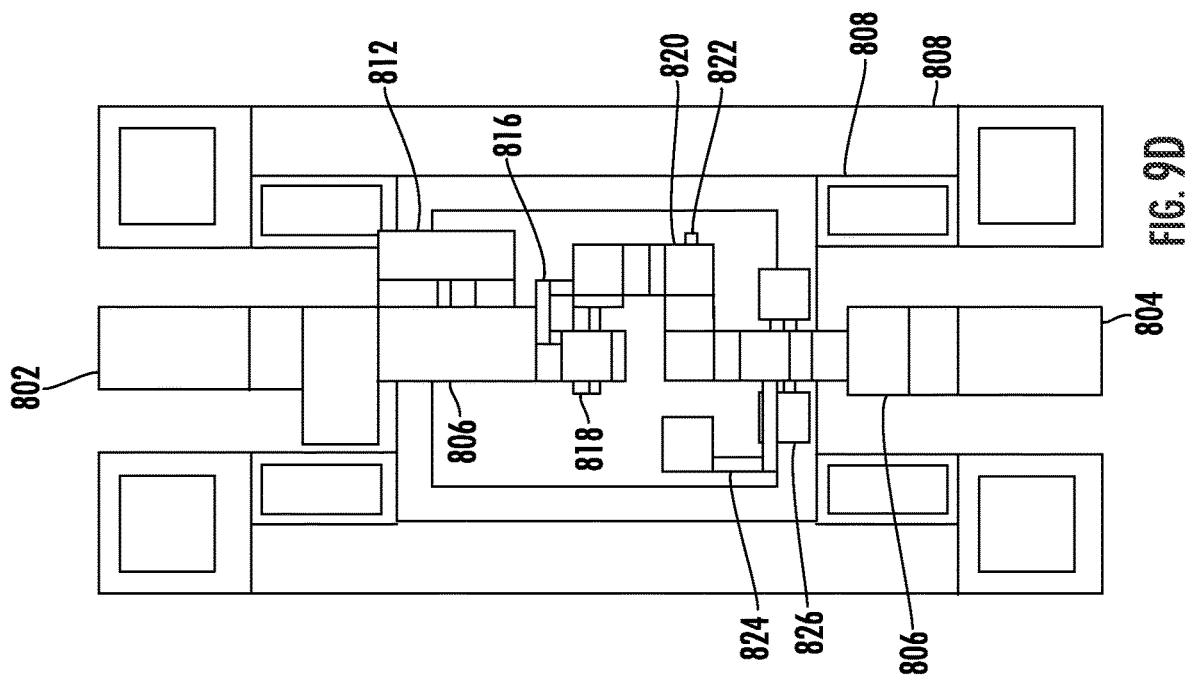
Figure 9C:
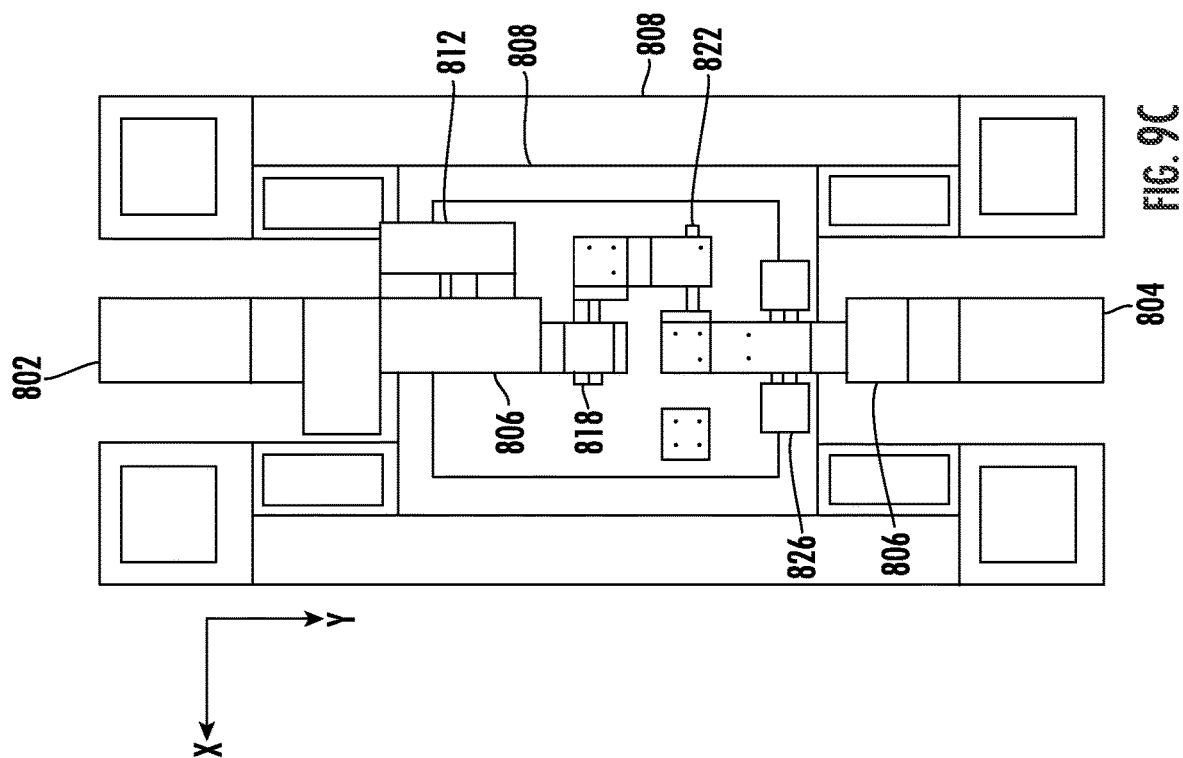

FIGS. 9A through 9D are a series of sequential top down views of the filter 600 of FIGS. 8A and 8B in which an additional dielectric layer is shown in each Figure. More specifically, FIG. 9A illustrates the first dielectric layer 828 and conductive layers 830 formed thereon. The first conductive layers 830 may include the ground plane 808. As illustrated, the ground plane 808 may be formed of multiple conductive layers. FIG. 9B additionally illustrates the second conductive layer 834 formed on the second dielectric layer 832. The second conductive layer 834 may include the first capacitor 814, second capacitor 818, third capacitor 822 and forth capacitor 826. FIG. 9C additionally illustrates the third conductive layer 838 that is formed on the third dielectric layer 836. The third conductive layer 838 may include portions of the signal path 806 and the first inductor 812. FIG. 9D illustrates the fourth conductive layer 842 formed on the fourth dielectric layer 840. The fourth conductive layer 842 may include the second inductor 816, third inductor 822, and fourth inductor 824. The dielectric layers 828, 832, 836, 840 are transparent to show the relative relocations of the various patterned conductive layers 830, 834, 838, 842.

Figure 10A:
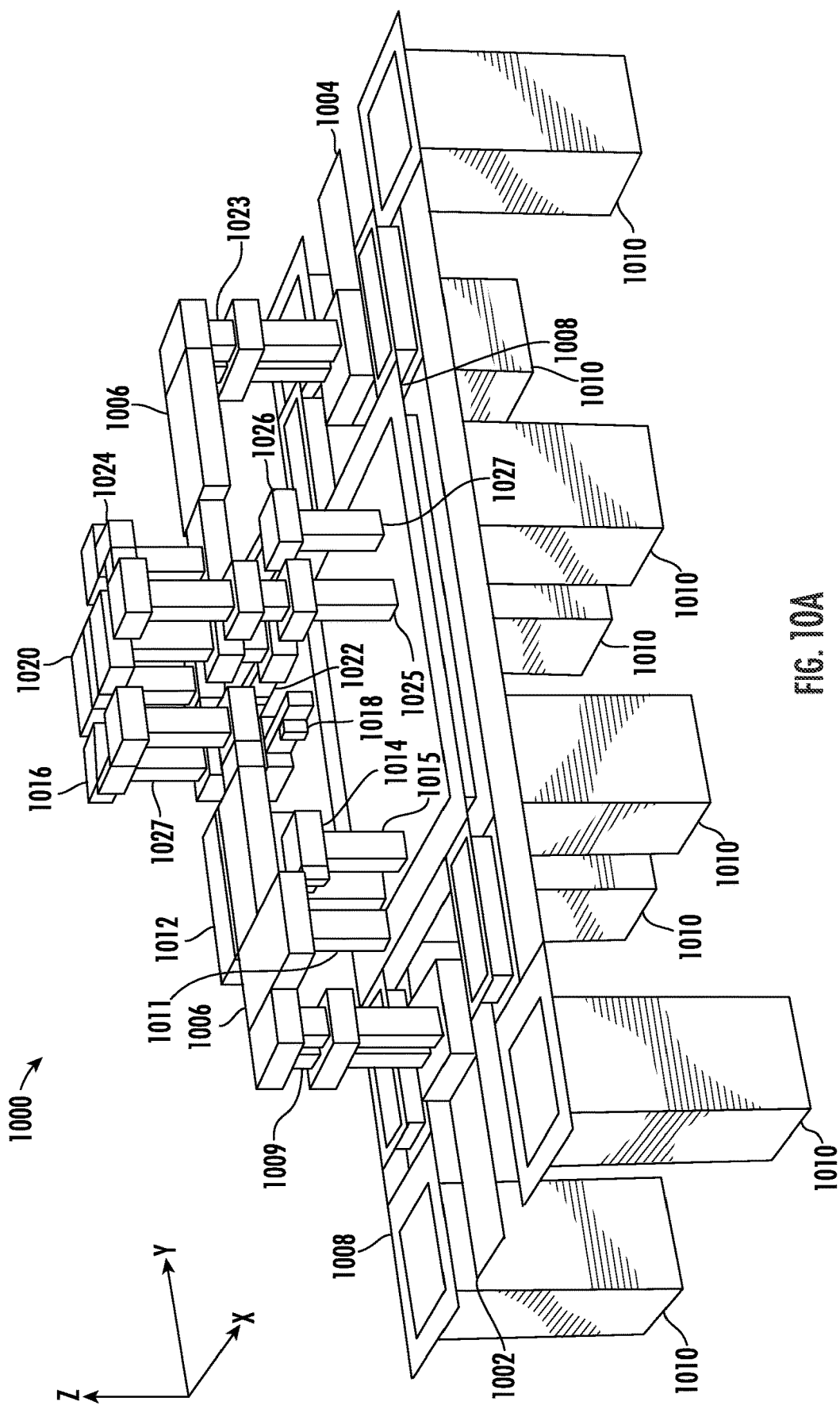
FIG. 10A is a perspective view of another embodiment of a multilayer filter according to aspects of the present disclosure.
Figure 10B:
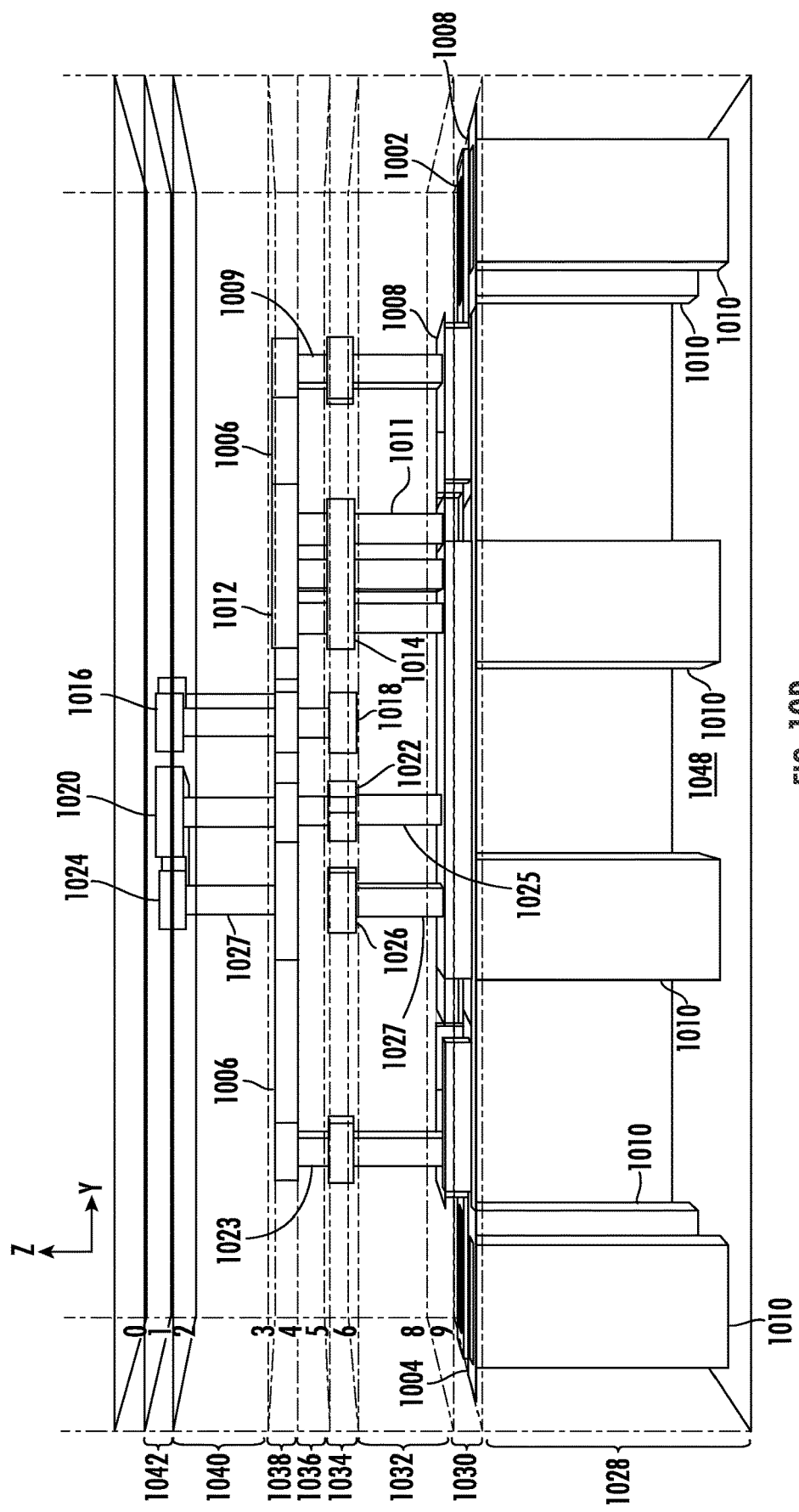
FIG. 10B is a side elevation view of the filter of FIG. 10A.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5H. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first via assembly 1009 connecting a portion of the signal path 1006 on the third dielectric layer 1036 with the input 1002. The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008 by a second via assembly 1015. The first capacitor 1014 may correspond with the first inductor capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. A portion of the signal path 1006 on the third dielectric layer 1036 may be connected with the output 1004 by a fourth via assembly 1023. Lastly, the filter 1000 may include a fourth inductor 1024 and fourth capacitor 1026 that are connected in parallel with each other and connected between the signal path 1006 and the ground plane 1008. The fourth inductor 1024 may be connected with the ground plane 1008 by a fifth via assembly 1025. The fourth capacitor 1026 may be connected with the ground plane 1008 by a sixth via assembly 1027. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias and/or via assemblies in a similar manner as described above with reference to FIGS. 3 through 5H. Each of the inductors 1012, 10110, 1020, 1024 may be connected with the signal path 1006 at a respective first location and connected with the signal path 1006 or the ground plane 1008 at a respective second location. Each of the inductors 1012, 10110, 1020, 1024 may have a respective effective length (e.g., in the X-Y plane) between the first location and the second location. Additionally, each of the inductors 1012, 10110, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed on the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed on a top surface of the third dielectric layer 1040.

FIGS. 11A through 11D are a series of sequential top down views of the filter 600 of FIGS. 10A and 10B in which an additional dielectric layer is shown in each Figure. More specifically, FIG. 11A illustrates the first dielectric layer 1028 and conductive layers 1030 formed thereon. The first conductive layers 1030 may include the ground plane 1008. As illustrated, the ground plane 1008 may be formed of multiple conductive layers. FIG. 11B additionally illustrates the second conductive layer 1034 formed on the second dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed on the third dielectric layer 1036. The third conductive layer 1038 may include portions of the signal path 1006 and the first inductor 1012. FIG. 11D illustrates the fourth conductive layer 1042 formed on the fourth dielectric layer 1040. The fourth conductive layer 1042 may include the second inductor 1016, third inductor 1022, and fourth inductor 1024. The dielectric layers 1028, 1032, 1036, 1040 are transparent to show the relative relocations of the various patterned conductive layers 1030, 1034, 1038, 1042.

IV. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

EXAMPLES

Computer modeling was used to simulate multilayer filters including via assemblies according to aspects of the present disclosure. Additionally, filters were built and tested. It should be understood that the following dimensions are merely given as examples and do not limit the scope of the present disclosure.

The thicknesses of the dielectric layers may generally be less than about 180 micrometers ("microns"). For instance, in some embodiments, the second layers 304, 632, 832, 1032 may be about 60 microns thick. The third layers 304, 636, 836, 1036 may be about 20 microns thick. The fourth layers 308, 640, 840, 1040 may be about 60 microns thick.

In some embodiments, the multilayer filters 300, 600, 800, 1000 described above may be configured to have the following respective via assembly lengths in the Z-direction:

TABLE 1

Example Via Assembly Lengths

| | First Via Assembly | Second Via Assembly | Third Via Assembly | Fourth Via Assembly | Fifth Via Assembly | Sixth Via Assembly |
|---|---|---|---|---|---|---|
| L (mm) | 0.080 | 0.060 | 0.080 | 0.080 | 0.160 | 0.060 |

In some embodiments, the multilayer filters 300, 600, 800, 1000 described above may be configured to have the following respective via assembly total cross-sectional areas:

TABLE 2

Example Via Assembly Total Cross-Sectional Areas

| | First Via Assembly | Second Via Assembly | Third Via Assembly | Fourth Via Assembly | Fifth Via Assembly | Sixth Via Assembly |
|---|---|---|---|---|---|---|
| | | | Total Cross-Sectional Area | | | |
| | ($mm^2$) | ($mm^2$) | ($mm^2$) | ($mm^2$) | ($mm^2$) | ($mm^2$) |
| Filter 300 | 0.021 | 0.093 | 0.021 | 0.021 | 0.010 | 0.062 |
| Filter 600 | 0.021 | 0.031 | 0.021 | 0.021 | 0.010 | 0.021 |
| Filter 800 | 0.021 | 0.010 | 0.031 | 0.021 | 0.010 | 0.021 |
| Filter 1000 | 0.021 | 0.010 | 0.031 | 0.021 | 0.010 | 0.021 |

In some embodiments, the multilayer filters 300, 600, 800, 1000 described above may include via assemblies having the following respective area-to-squared-length ratios:

TABLE 3

Example Via Assembly Area-To-Squared-Length Ratios

| | First Via Assembly | Second Via Assembly | Third Via Assembly | Fourth Via Assembly | Fifth Via Assembly | Sixth Via Assembly |
|---|---|---|---|---|---|---|
| Filter 300 | 3.23 | 25.81 | 3.23 | 3.23 | 0.40 | 17.20 |
| Filter 600 | 3.23 | 8.60 | 3.23 | 3.23 | 0.40 | 5.73 |
| Filter 800 | 3.23 | 2.87 | 4.84 | 3.23 | 0.40 | 5.73 |
| Filter 1000 | 3.23 | 2.87 | 4.84 | 3.23 | 0.40 | 5.73 |

The via assemblies may include vias having approximately equal widths of about 100 microns. The spacing distance between the vias may be about 50 microns. The width-to-spacing ratios of the via assemblies may be about 2.

In some embodiments, the via assemblies may include multiple vias that provide greater surface area than a single via. As discussed above, increased surface area may increase the conductivity of the via assembly due to the "skin effect." In some embodiments, the multilayer filters 300, 600, 800, 1000 described above may be configured to have via assemblies with the following surface areas:

TABLE 4

Example Via Assembly Surface Areas

| | First Via Assembly | Second Via Assembly | Third Via Assembly | Fourth Via Assembly | Fifth Via Assembly | Sixth Via Assembly |
|---|---|---|---|---|---|---|
| | | | Surface Area | | | |
| | ($mm^2$) | ($mm^2$) | ($mm^2$) | ($mm^2$) | ($mm^2$) | ($mm^2$) |
| Filter 300 | 0.065 | 0.219 | 0.065 | 0.065 | 0.065 | 0.146 |
| Filter 600 | 0.065 | 0.073 | 0.065 | 0.065 | 0.065 | 0.049 |
| Filter 800 | 0.065 | 0.024 | 0.098 | 0.065 | 0.065 | 0.049 |
| Filter 1000 | 0.065 | 0.024 | 0.098 | 0.065 | 0.065 | 0.049 |

In some embodiments, the multilayer filters 300, 600, 800, 1000 described above may be configured to have via assemblies with the following surface-area-to-squared-length ratios:

TABLE 5

Example Via Assembly Surface-Area-To-Squared-Length Ratios

| | First Via Assembly | Second Via Assembly | Third Via Assembly | Fourth Via Assembly | Fifth Via Assembly | Sixth Via Assembly |
|---|---|---|---|---|---|---|
| Filter 300 | 10.2 | 61.0 | 10.2 | 10.2 | 2.5 | 40.6 |
| Filter 600 | 10.2 | 20.3 | 10.2 | 10.2 | 2.5 | 13.5 |
| Filter 800 | 10.2 | 6.8 | 15.2 | 10.2 | 2.5 | 13.5 |
| Filter 1000 | 10.2 | 6.8 | 15.2 | 10.2 | 2.5 | 13.5 |

Figure 12:
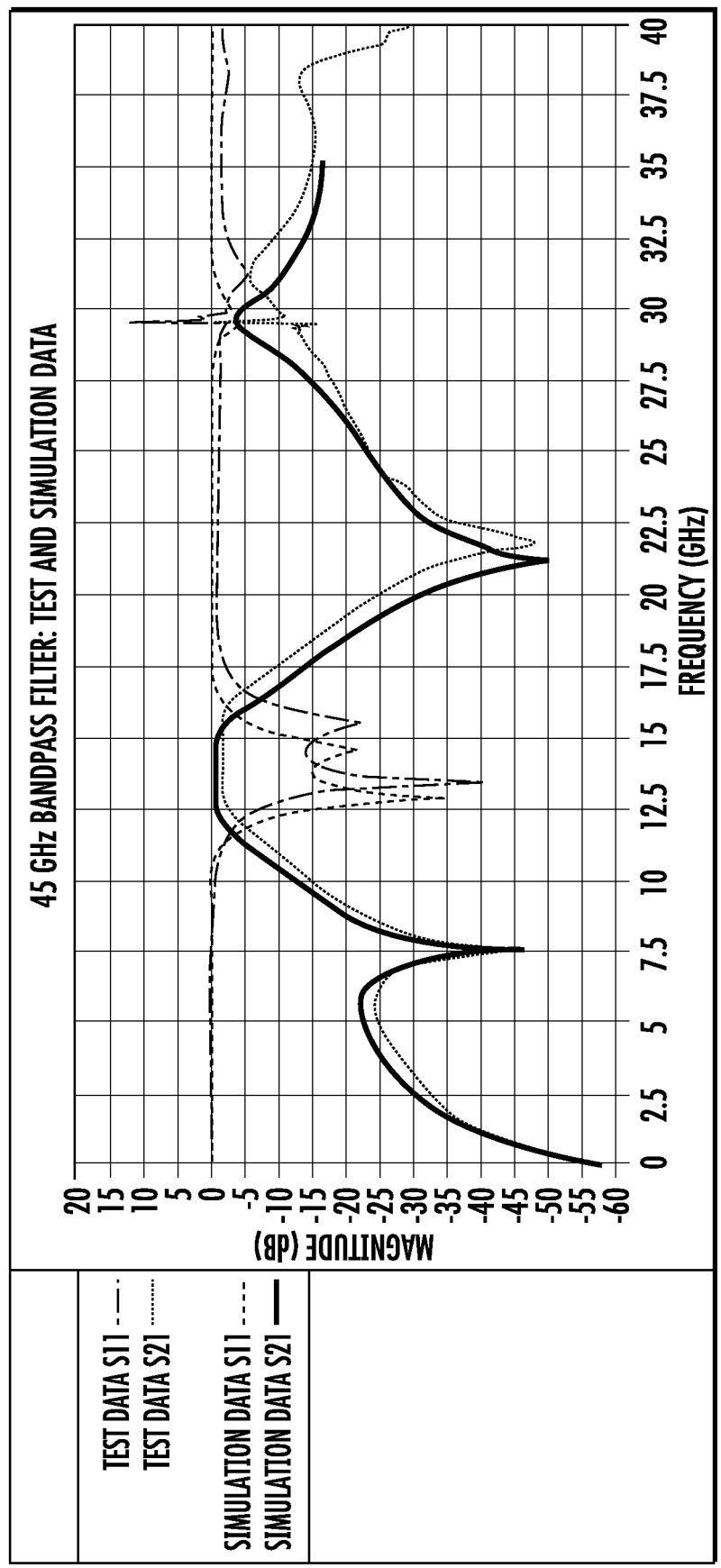
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
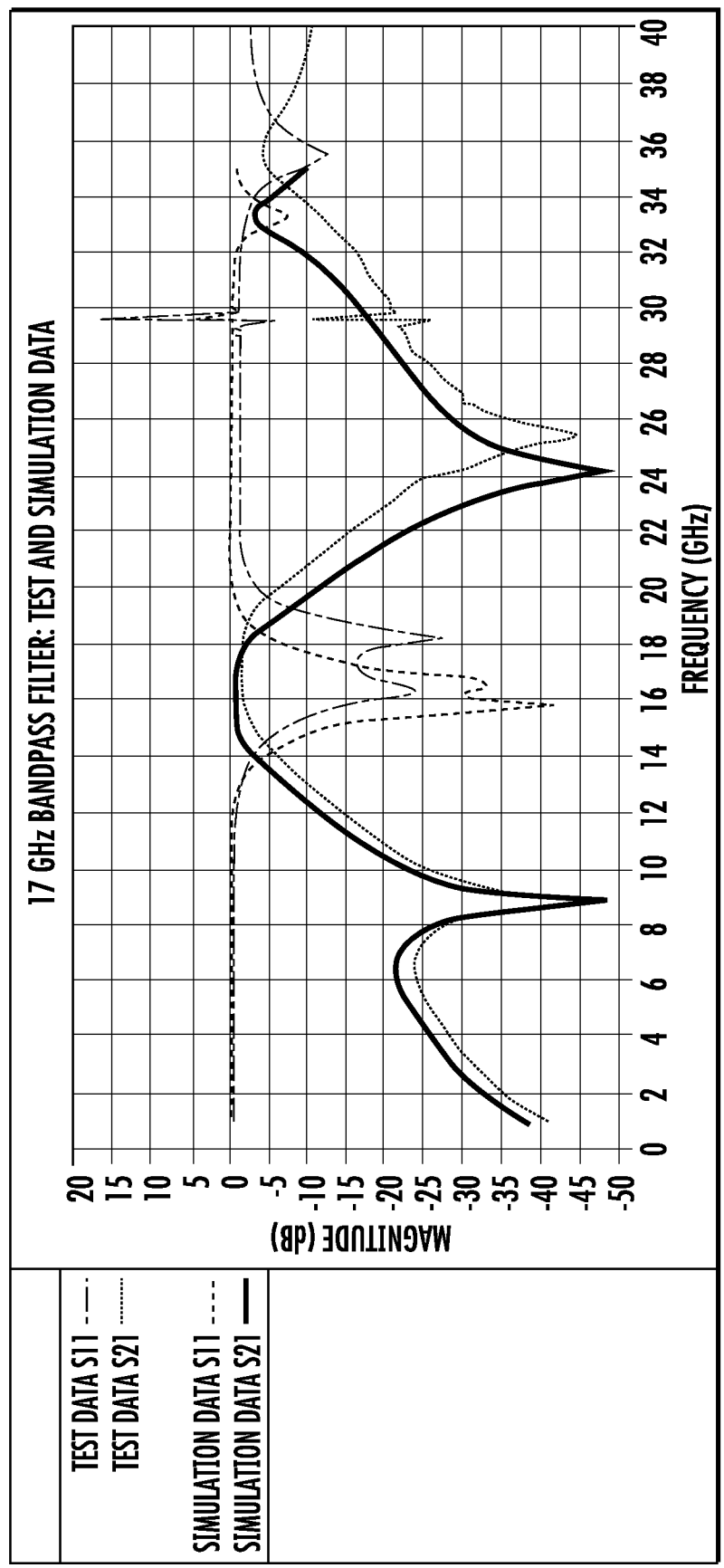
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
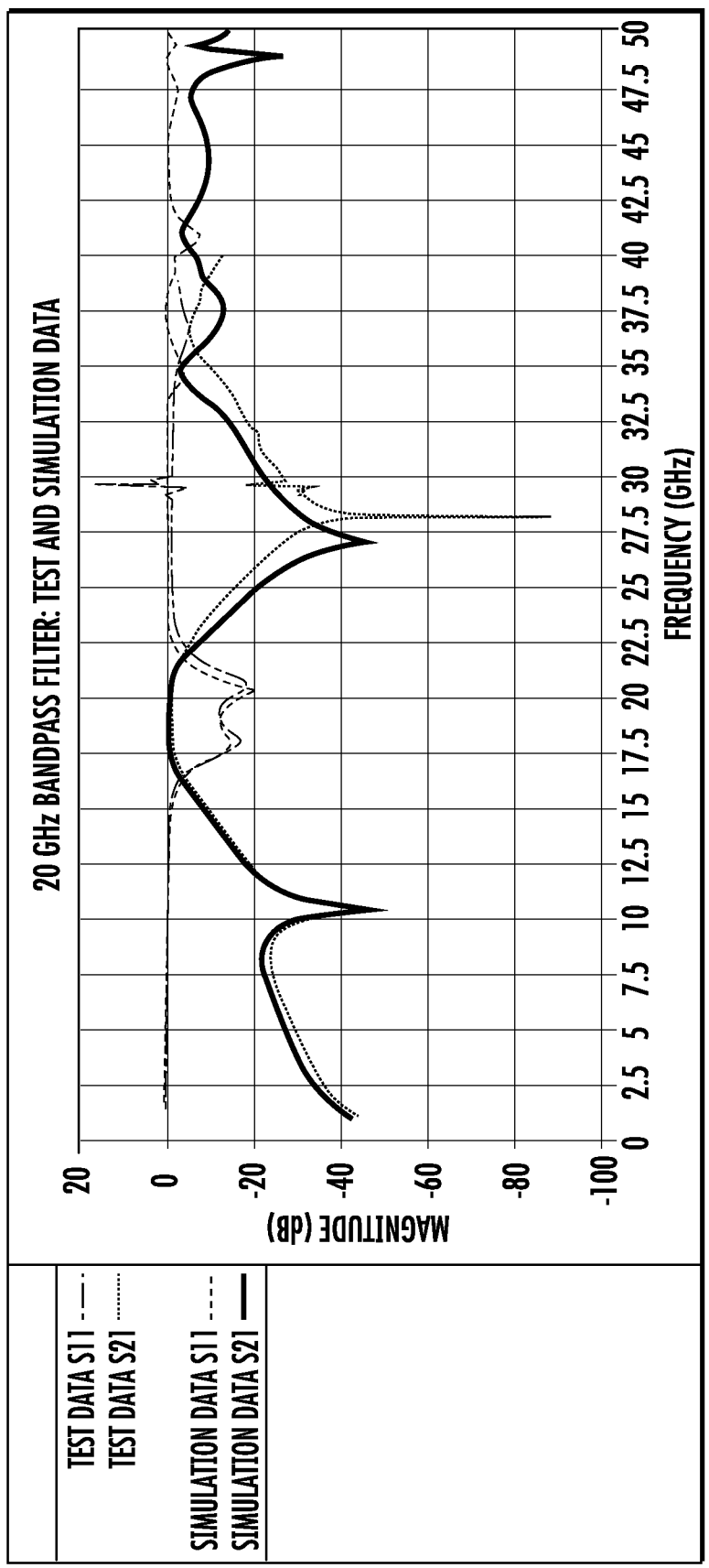
FIG. 14 is a plot of test data including measured insertion loss and return loss values for a filter constructed according to aspects of the present disclosure.
Figure 5:
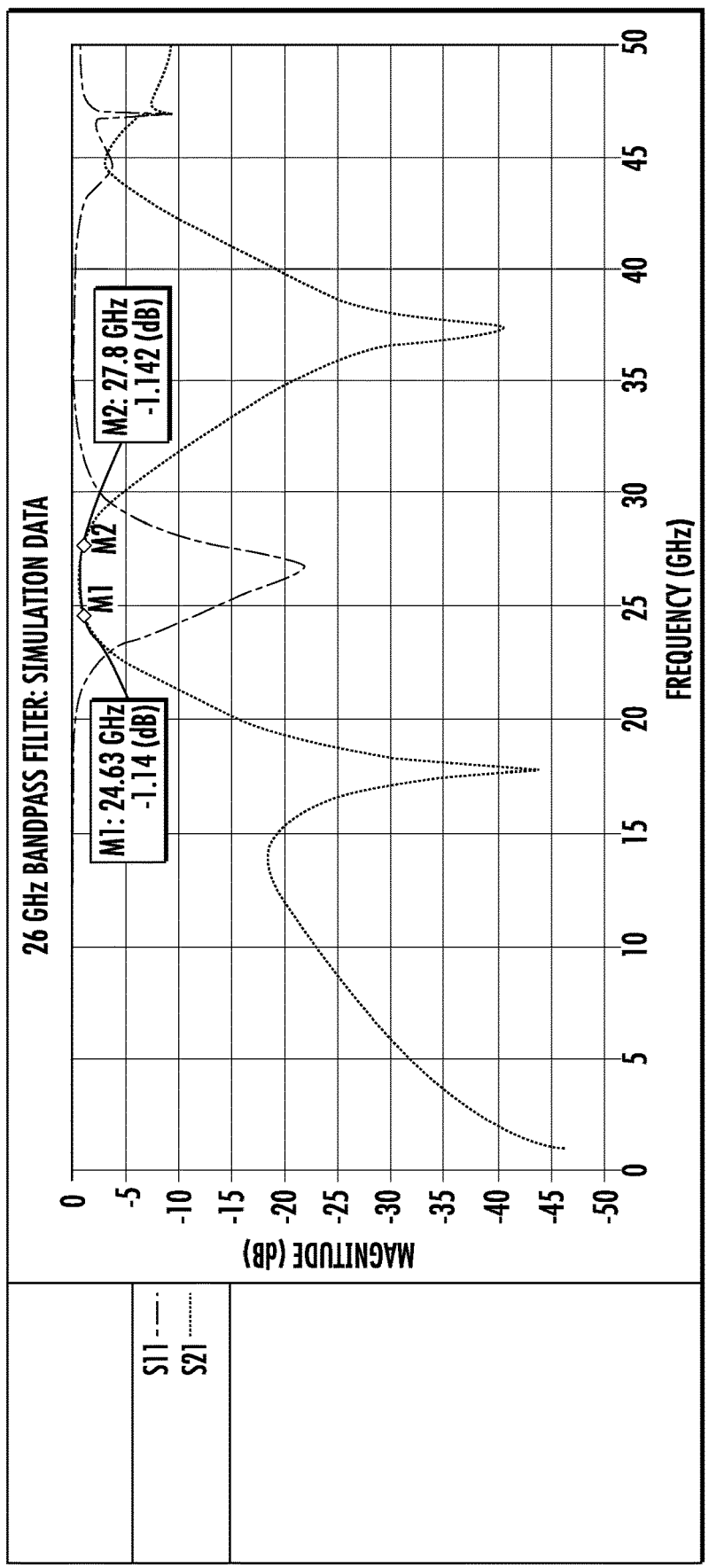
FIGS. 5C and 5D are top down and side elevation views, respectively, of another embodiment of a via assembly in which vias are arranged in a grid and have circular cross-sectional shapes according to aspects of the present disclosure.

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16:
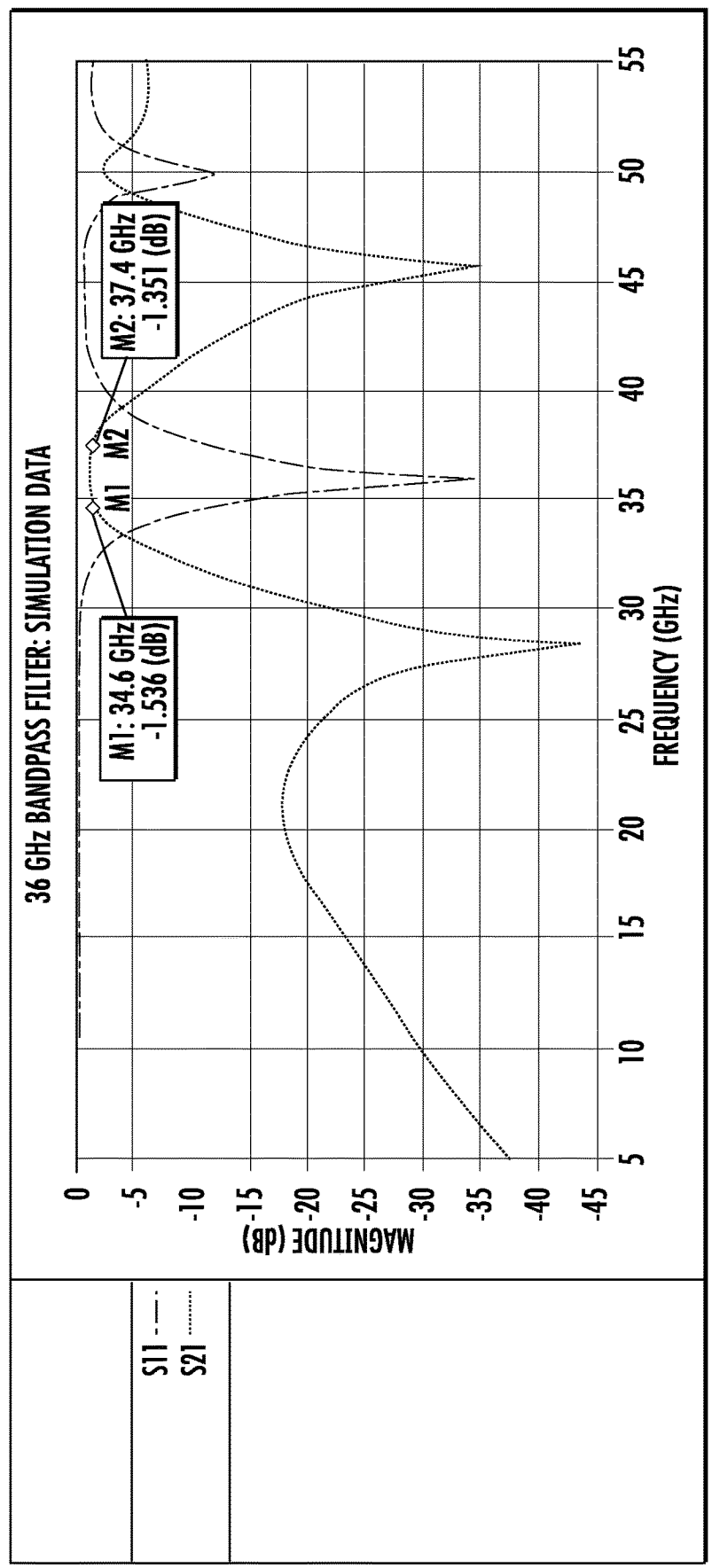
FIG. 16 is a plot of simulation data including insertion loss and return loss values from a computer analysis of a filter according to aspects of the present disclosure.

Referring to FIG. 16, the multilayer filter 800 described above with reference to FIGS. 8A through 9D was simulated. Simulated insertion loss ($S_{21}$) values and simulated return loss ($S_{11}$) values are plotted from 0 GHz to 55 GHz. The pass band is from about 34.6 GHz to about 37.4 GHz.

Figure 17:
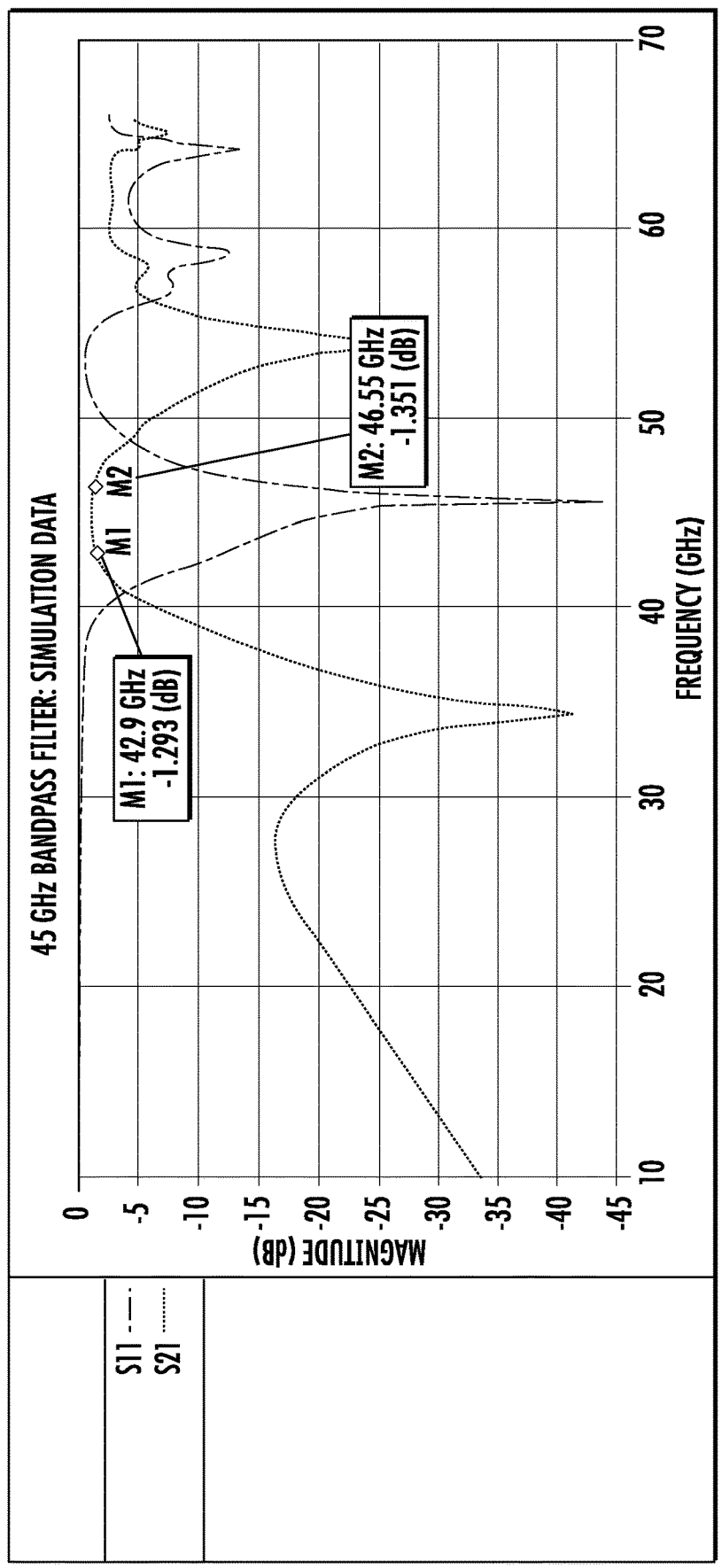
FIG. 17 is a plot of simulation data including insertion loss and return loss values from a computer analysis of a filter according to aspects of the present disclosure.

Referring to FIG. 17, the multilayer filter 1000 described above with reference to FIGS. 10A through 11D was simulated. Simulated insertion loss ($S_{21}$) values and simulated return loss ($S_{11}$) values are plotted from 0 GHz to 70 GHz. The pass band is from about 42.9 GHz to about 46.6 GHz.

Test Methods

Figure 18:
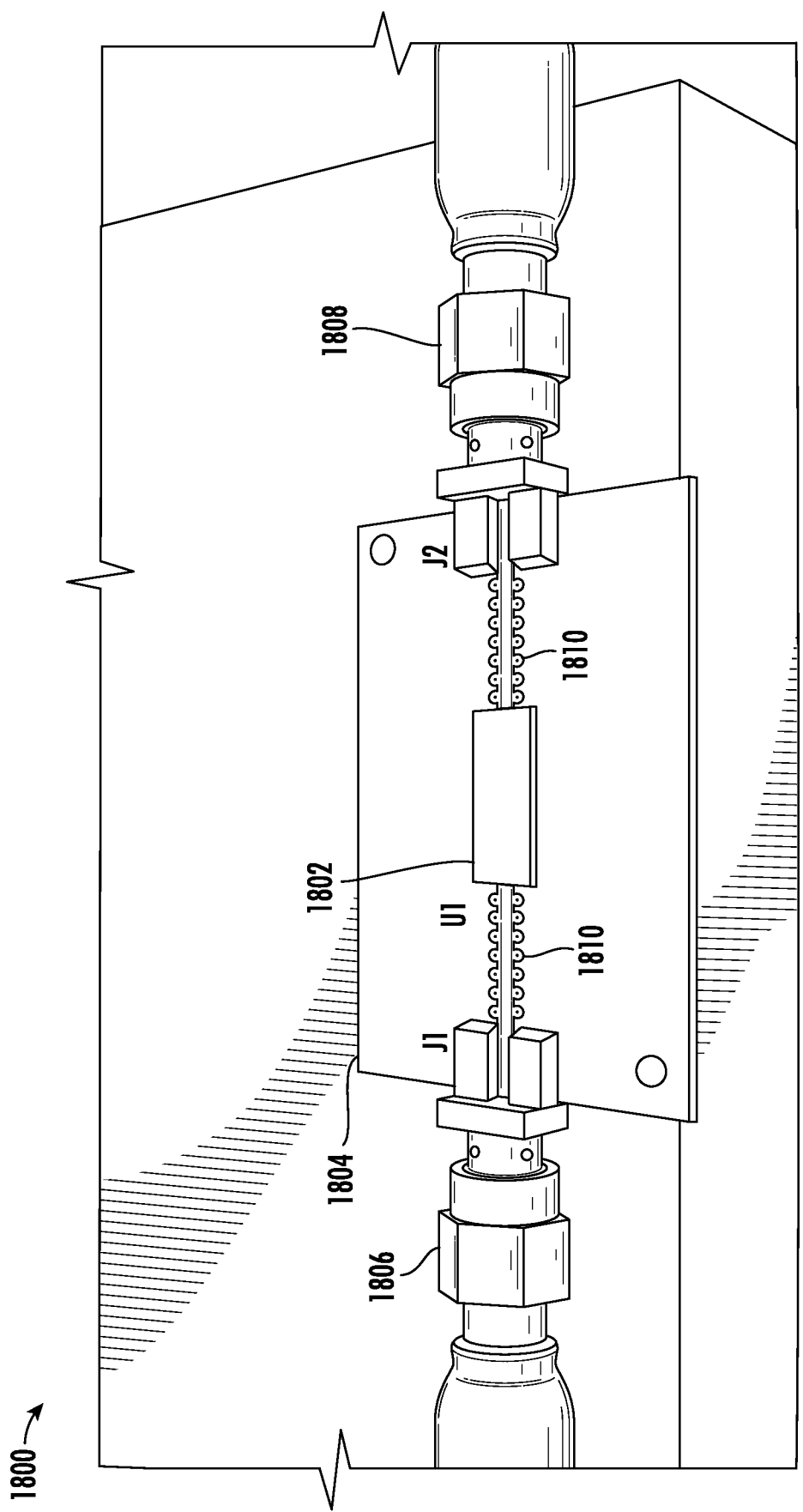
FIG. 18 is a perspective view of a testing assembly including a filter according to aspects of the present disclosure.

Referring to FIG. 18, a testing assembly 1800 can be used to test performance characteristics, such as insertion loss and return loss, of a multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., an 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multilayer filter comprising:
a dielectric layer having a top surface, a bottom surface, and a thickness in a Z-direction between the top surface and the bottom surface;
a conductive layer formed on the top surface of the dielectric layer;
a via assembly formed in the dielectric layer and connected to the conductive layer on the top surface of the dielectric layer, the via assembly extending to the bottom surface of the dielectric layer, the via assembly having a length in the Z-direction and a total cross-sectional area in an X-Y plane that is perpendicular to the Z-direction, and wherein the via assembly has an area-to-squared-length ratio that is greater than about 3.25, wherein the via assembly comprises a plurality of vias that are spaced apart by a spacing distance that is less than about 200 microns.

2. The multilayer filter of claim 1, further comprising a ground plane, and wherein the via assembly is connected at the bottom surface of the dielectric layer with the ground plane.

3. The multilayer filter of claim 1, wherein the conductive layer comprises an inductor.

4. The multilayer filter of claim 1, wherein the conductive layer comprises a capacitor electrode.

5. The multilayer filter of claim 1, further comprising a dielectric material that comprises an epoxy.

6. The multilayer filter of claim 1, wherein the total cross-sectional area comprises the sum of respective cross-sectional areas of the plurality of vias in the X-Y plane.

7. The multilayer filter of claim 1, wherein the plurality of vias are arranged in a repeating pattern.

8. The multilayer filter of claim 1, wherein the plurality of vias are arranged in an m×n grid, wherein m and n each equal two or greater.

9. The multilayer filter of claim 1, wherein the plurality of vias are approximately evenly spaced apart in at least one of an X-direction or a Y-direction, the X-direction and Y-direction lying in the X-Y plane, the X-direction being perpendicular to the Y-direction.

10. The multilayer filter of claim 1, further comprising a dielectric material having a dielectric constant that is greater than about 100 as determined in accordance with ASTM D2149-13 at an operating temperature of 25° C. and frequency of 1 kHz.

11. The multilayer filter of claim 1, wherein the plurality of vias are spaced apart by respective spacing distances and have respective widths in the X-Y plane, and wherein a width-to-spacing ratio is greater than about 1.

12. The multilayer filter of claim 1, wherein the plurality of vias that have approximately equal respective cross-sectional areas.

13. The multilayer filter of claim 1, wherein the via assembly has a surface-area-to-squared-length ratio that is greater than about 6.5.

14. The multilayer filter of claim 1, wherein the via assembly comprises at least one filled via.

15. The multilayer filter of claim 1, wherein the via assembly comprises at least one unfilled via.

16. The multilayer filter of claim 1, wherein the via assembly comprises at least one via having a circular cross-sectional shape.

17. The multilayer filter of claim 1, wherein the via assembly comprises at least one via having a rectangular cross-sectional shape.

18. The multilayer filter of claim 1, further comprising an additional dielectric layer having a top surface and a bottom surface and an intermediary conductive layer formed on the top surface of the additional dielectric layer, and wherein:
the dielectric layer is arranged on the top surface of the additional dielectric layer; and
the via assembly comprises at least one via formed in the additional dielectric layer and connected with the intermediary conductive layer.

19. The multilayer filter of claim 18, wherein the length of the via assembly in the Z-direction includes a length of the at least one via formed in the additional dielectric layer.

20. The multilayer filter of claim 1, wherein the thickness of the dielectric layer is less than about 100 microns.

21. The multilayer filter of claim 1, comprising a dielectric material having a dielectric constant that is less than about 100 as determined in accordance with ASTM D2149-13 at an operating temperature of 25° C. and frequency of 1 kHz.

22. The multilayer filter of claim 1, further comprising an organic dielectric material.

23. The multilayer filter of claim 22, wherein the organic dielectric material comprises at least one of liquid crystalline polymer or polyphenyl ether.

24. The multilayer filter of claim 1, wherein the multilayer filter has a characteristic frequency that is greater than about 6 GHz.

25. The multilayer filter of claim 24, wherein the characteristic frequency comprises at least one of a low pass frequency, a high pass frequency, or an upper bound of a bandpass frequency.

26. A method of forming a multilayer filter, the method comprising:
providing a dielectric layer having a top surface, a bottom surface, and a thickness in a Z-direction between the top surface and the bottom surface;
depositing a conductive layer on the top surface of the dielectric layer;
forming a via assembly in the dielectric layer, the via assembly being connected to the conductive layer on the top surface of the dielectric layer, the via assembly extending to the bottom surface of the dielectric layer, the via assembly having a length in the Z-direction and a total cross-sectional area in an X-Y plane that is perpendicular to the Z-direction, and wherein the via assembly has an area-to-squared-length ratio that is greater than about 3.25, wherein the via assembly comprises a plurality of vias that are spaced apart by a spacing distance that is less than about 200 microns.

27. A multilayer filter comprising:
a dielectric layer having a top surface, a bottom surface, and a thickness in a Z-direction between the top surface and the bottom surface;
a conductive layer formed on the top surface of the dielectric layer;
a via assembly formed in the dielectric layer and connected to the conductive layer on the top surface of the dielectric layer, the via assembly extending to the bottom surface of the dielectric layer, the via assembly having a length in the Z-direction and a total cross-sectional area in an X-Y plane that is perpendicular to the Z-direction, and wherein the via assembly has an area-to-squared-length ratio that is greater than about 3.25, wherein the via assembly comprises a plurality of vias that are spaced apart by respective spacing distances and have respective widths in the X-Y plane, and wherein a width-to-spacing ratio is greater than about 1.

28. The multilayer filter of claim 27, wherein the multilayer filter has a characteristic frequency that is greater than about 6 GHz.

29. The multilayer filter of claim 28, wherein the characteristic frequency comprises at least one of a low pass frequency, a high pass frequency, or an upper bound of a bandpass frequency.

30. The multilayer filter of claim 27, further comprising a ground plane, and wherein the via assembly is connected at the bottom surface of the dielectric layer with the ground plane.

31. The multilayer filter of claim 27, wherein the conductive layer comprises an inductor.

32. The multilayer filter of claim 27, wherein the conductive layer comprises a capacitor electrode.

33. The multilayer filter of claim 27, further comprising a dielectric material that comprises an epoxy.

34. The multilayer filter of claim 27, wherein the total cross-sectional area comprises the sum of respective cross-sectional areas of the plurality of vias in the X-Y plane.

35. The multilayer filter of claim 27, wherein the plurality of vias are arranged in a repeating pattern.

36. The multilayer filter of claim 27, wherein the plurality of vias are arranged in an m×n grid, wherein m and n each equal two or greater.

37. The multilayer filter of claim 27, wherein the plurality of vias are approximately evenly spaced apart in at least one of an X-direction or a Y-direction, the X-direction and Y-direction lying in the X-Y plane, the X-direction being perpendicular to the Y-direction.

38. The multilayer filter of claim 27, wherein the plurality of vias have approximately equal respective cross-sectional areas.

39. The multilayer filter of claim 27, wherein the via assembly has a surface-area-to-squared-length ratio that is greater than about 6.5.

40. The multilayer filter of claim 27, wherein the via assembly comprises at least one filled via.

41. The multilayer filter of claim 27, wherein the via assembly comprises at least one unfilled via.

42. The multilayer filter of claim 27, wherein the via assembly comprises at least one via having a circular cross-sectional shape.

43. The multilayer filter of claim 27, wherein the via assembly comprises at least one via having a rectangular cross-sectional shape.

44. The multilayer filter of claim 27, further comprising an additional dielectric layer having a top surface and a bottom surface and an intermediary conductive layer formed on the top surface of the additional dielectric layer, and wherein:
the dielectric layer is arranged on the top surface of the additional dielectric layer; and
the via assembly comprises at least one via formed in the additional dielectric layer and connected with the intermediary conductive layer.

45. The multilayer filter of claim 44, wherein the length of the via assembly in the Z-direction includes a length of the at least one via formed in the additional dielectric layer.

46. The multilayer filter of claim 27, wherein the thickness of the dielectric layer is less than about 100 microns.

47. The multilayer filter of claim 27, comprising a dielectric material having a dielectric constant that is less than about 100 as determined in accordance with ASTM D2149-13 at an operating temperature of 25° C. and frequency of 1 kHz.

48. The multilayer filter of claim 27, further comprising a dielectric material having a dielectric constant that is greater than about 100 as determined in accordance with ASTM D2149-13 at an operating temperature of 25° C. and frequency of 1 kHz.

49. The multilayer filter of claim 27, further comprising an organic dielectric material.

50. The multilayer filter of claim 27, wherein the organic dielectric material comprises at least one of liquid crystalline polymer or polyphenyl ether.

* * * * *